US007117418B2

(12) United States Patent
Thesling et al.

(10) Patent No.: US 7,117,418 B2
(45) Date of Patent: Oct. 3, 2006

(54) SOFT INPUT-SOFT OUTPUT FORWARD ERROR CORRECTION DECODING FOR TURBO CODES

(75) Inventors: William H. Thesling, Bedford, OH (US); Sameep Dave, Warrensville Heights, OH (US)

(73) Assignee: Comtech AHA Corporation, Moscow, ID (US)

( * ) Notice: Subject to any disclaimer, the term of this patent is extended or adjusted under 35 U.S.C. 154(b) by 630 days.

(21) Appl. No.: 09/954,698

(22) Filed: Sep. 11, 2001

(65) Prior Publication Data

US 2002/0124223 A1 Sep. 5, 2002

Related U.S. Application Data

(60) Provisional application No. 60/231,682, filed on Sep. 11, 2000.

(51) Int. Cl.
*H03M 13/00* (2006.01)

(52) U.S. Cl. ........................ 714/755; 714/782; 714/783; 714/777; 714/780; 375/341

(58) Field of Classification Search .................. 714/758, 714/782, 783, 746, 752, 755, 774, 751, 780, 714/777
See application file for complete search history.

(56) References Cited

U.S. PATENT DOCUMENTS

| 4,322,848 | A | 3/1982 | Snyder, Jr. |
|---|---|---|---|
| 4,763,331 | A | 8/1988 | Matsumoto |
| 4,882,733 | A | 11/1989 | Tanner |
| 5,157,671 | A | 10/1992 | Karplus |
| 5,208,816 | A | 5/1993 | Seshardi et al. |
| 5,319,649 | A | 6/1994 | Raghavan et al. |
| 5,537,444 | A | 7/1996 | Nill et al. |
| 5,563,897 | A | 10/1996 | Pyndiah et al. |
| 5,657,354 | A | 8/1997 | Thesling, III et al. |
| 5,737,345 | A | 4/1998 | Pelz et al. |
| 5,825,832 | A | 10/1998 | Benedetto |

(Continued)

OTHER PUBLICATIONS

Thesis by William H. Thesling, "Efficient Block Decoding Algorithms Exploiting Channel Measurement Information", Aug. 1995.

R. Pyndiah, P. Combelles and P. Adde, "A very low complexity block turbo decoder for product codes," in proc. of IEEE 1996, pp. 101–105.

A. Picart and R. Pyndiah, "Performance of Turbo–Decoded Product Codes Used in Multilevel Coding," in proc. of IEEE ICC'96 Conference, Dallas TX 1996, pp. 107–111.

R. Pyndiah, A. Glavieux, A. Picart and S. Jacq, "Near optimum decoding of product codes," in proc. of IEEE Globecom '94 Conference, vol. 1/3, Nov.–Dec. 1994, San Francisco, pp. 339–343.

R. Pyndiah, Near–optimum decoding of product codes: Block turbo codes, IEEE Transactions on Communications, vol. 46, No. 8, Aug. 1998, pp. 1003–1010.

*Primary Examiner*—Phung My Chung
(74) *Attorney, Agent, or Firm*—Haverstock & Owens LLP

(57) ABSTRACT

A method of turbo decoding using soft input-soft output information. A vector of data is sampled from a channel of data. The vector of data is then processed to output a final code word of bits. A final reliability vector of reliability values associated with the final code word is generated, such that each bit of the final code word of bits has a corresponding reliability value in the final reliability vector. Corresponding reliability values for one or more bit positions of the final code word are determined by a difference of distance metrics, and corresponding reliability values for one or more bit positions of the final code word are determined utilizing a numerical approximation.

12 Claims, 4 Drawing Sheets

U.S. PATENT DOCUMENTS

| | | |
|---|---|---|
| 6,028,899 A | 2/2000 | Petersen |
| 6,065,147 A | 5/2000 | Pyndiah et al. |
| 6,122,763 A | 9/2000 | Pyndiah et al. |
| 6,553,536 B1 * | 4/2003 | Hassner et al. ............. 714/780 |
| 6,629,286 B1 * | 9/2003 | Berens et al. ............... 714/755 |
| 6,634,007 B1 * | 10/2003 | Koetter et al. ............. 714/784 |

* cited by examiner

SOFT INPUT-SOFT OUTPUT FORWARD ERROR CORRECTION DECODING FOR TURBO CODES

This application claims priority under 35 USC § 119(e) from U.S. Provisional application Ser. No. 60/231,682 entitled "Soft Input Soft Output Forward Error Correction Decoding For Turbo Codes" and filed Sep. 11, 2000, and is related to U.S. Pat. No. 5,930,272 by Thesling, entitled "Block Decoding With Soft Output Information" filed Jun. 10, 1997 and issued Jul. 27, 1999, the entirety of which is incorporated herein by reference.

BACKGROUND OF THE INVENTION

1. Field of the Invention

This invention is related generally to the decoding of linear block codes, and more specifically to a method of soft input-soft output decoding.

2. Description of the Related Art

The transmission of digital information has become, and will continue to be, the most common form of communications for years to come. Digital communication links in the form of satellite communications systems, wireless LANs, digital cellular communications systems, digital video broadcast, and many others, are used for the efficient and flexible transmission of a wide variety of data services. However, in most, if not all cases, the digital data is subjected to imperfect transmission mechanisms which introduce various levels of noise into the transmitted signal and threaten the reliability of the transmitted data at the receiving end. As a result, designers have continued to develop error-detecting and correcting tools in an effort to improve data reliability in communications regimes.

Forward error correction is the capability of a receiving station to correct a transmission error, and can increase throughput of a data link operating in a noisy environment. The transmitting station appends information to the data in the form of error correction bits, however, the number of error correction bits also impacts the size of the transmitted word, which ultimately effects the bandwidth of the data channel. Therefore, the number of error-correction bits must be chosen with bandwidth, and other factors in mind.

Turbo codes are a relatively new class of correction codes which represent the next leap forward in error correction. The designer has more flexibility to determine the required transmission energy, bandwidth, and system complexity with the increased error-correction performance offered by turbo codes. Turbo codes break a complex decoding problem into simple steps. Each step is then repeated until a solution is reached. The complexity of convolutional codes has slowed the development of low-cost turbo convolutional decoders. However, turbo product codes offer substantially higher data throughput in hardware at a more reasonable cost by solving multiple steps simultaneously. As a result, turbo product codes are receiving more attention in advanced terrestrial and satellite communications systems due to their unmatched error-correction capability.

A sequence of logical 1s and 0s in a digital message is typically sent from a source device through a channel medium to a decoder at a destination end for decoding. However, before transmission, the logical 1s and 0s are converted into voltages, and transmitted through the channel medium as +1 volt and −1 volt, respectively. Channel noise is inherently introduced into the voltage signal which is received by the receiver at the destination device. The decoder at the destination device will then make a hard decision based upon the received voltage signals. (With a threshold placed at 0 volts, a value greater than or equal to 0 volts is interpreted as a logical 1, and a value less than 0 volts is interpreted as a logical 0.) This is termed hard decision decoding (HDD), since each symbol, as first represented by a voltage, is converted to logical 1s and 0s prior to decoding. Soft decision decoding utilizes more information than the logical 1s and 0s by utilizing the received voltage signals, usually quantized to three or four bits.

Turbo coding (also called "iterative" decoding) of product codes (and variances thereof) requires the use of a decoder that uses soft information as input ("soft input information"), and yields soft information at the output ("soft output information"). Soft information is a more detailed measure of received channel information. Soft input information to a decoder is that which indicates what value each received bit is assigned (e.g., a logical 1 or 0), and an associated value that indicates the reliability or confidence that the value assigned to the particular received bit is correct. The decoder then uses the soft input information to decode the received information to produce an estimate of the original transmitted data. Soft output information of a decoder is that information which not only provides an accurate estimate of the original message, but also reliability or confidence information as to the likelihood that the decoded bit is correct. Decoding with soft input information yielding soft output information is called SISO (Soft Input-Soft Output) decoding.

Prior art SISO turbo decoding algorithms are complex, bandwidth-intensive, and costly to implement. What is needed is an efficient and more cost effective algorithm which is easier to implement and exhibits near optimal SISO decoding with a tiny fraction of the complexity of the prior art decoding algorithms.

SUMMARY OF THE INVENTION

The invention disclosed and claimed herein, in one aspect thereof, is a method of decoding a block or vector of data. A vector of data is received from the channel. The vector of data is then processed to output a final code word of bits. A final reliability vector of reliability values associated with the final code word is generated such that each bit of the final code word of bits has a corresponding reliability value in the final reliability vector. Corresponding reliability values for one or more bit positions of the final code word are determined by a difference of distance metrics, and corresponding reliability values for one or more bit positions of the final code word are determined utilizing a numerical approximation.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Disclosed herein is a new and efficient algorithm, the SISO-TC (Soft Input-Soft Output—Third Chance)

algorithm, for achieving near optimal SISO decoding with less complexity then prior art SISO decoding architectures, and with soft output information. In addition to yielding an output bit sequence, a measure of the reliability of each output bit in that sequence is available as well. This is important for turbo decoding since soft output information is required as soft input information for the subsequent decoding step.

The SISO-TC algorithm generates soft output information for each bit of the output code word based upon a difference of correlation values, or some other metric substantially equivalent to correlation such as the difference metric as given in Equation 52 of the dissertation by Thesling, William H., EFFICIENT BLOCK DECODING ALGORITHMS EXPLOITING CHANNEL MEASUREMENT INFORMATION, Department of Engineering, Cleveland State University, December 1995, the entirety of which is incorporated by reference, where the code words exist to compute these metrics, but uses an approximation for the remaining bit positions for which there are no code words to compute the difference of correlation values (or difference metrics). The disclosed algorithm generates a subset of code words required in prior art systems, which results in implementation of a less complex and more cost effective decoding architecture.

General Decoding Method

Figure 1:
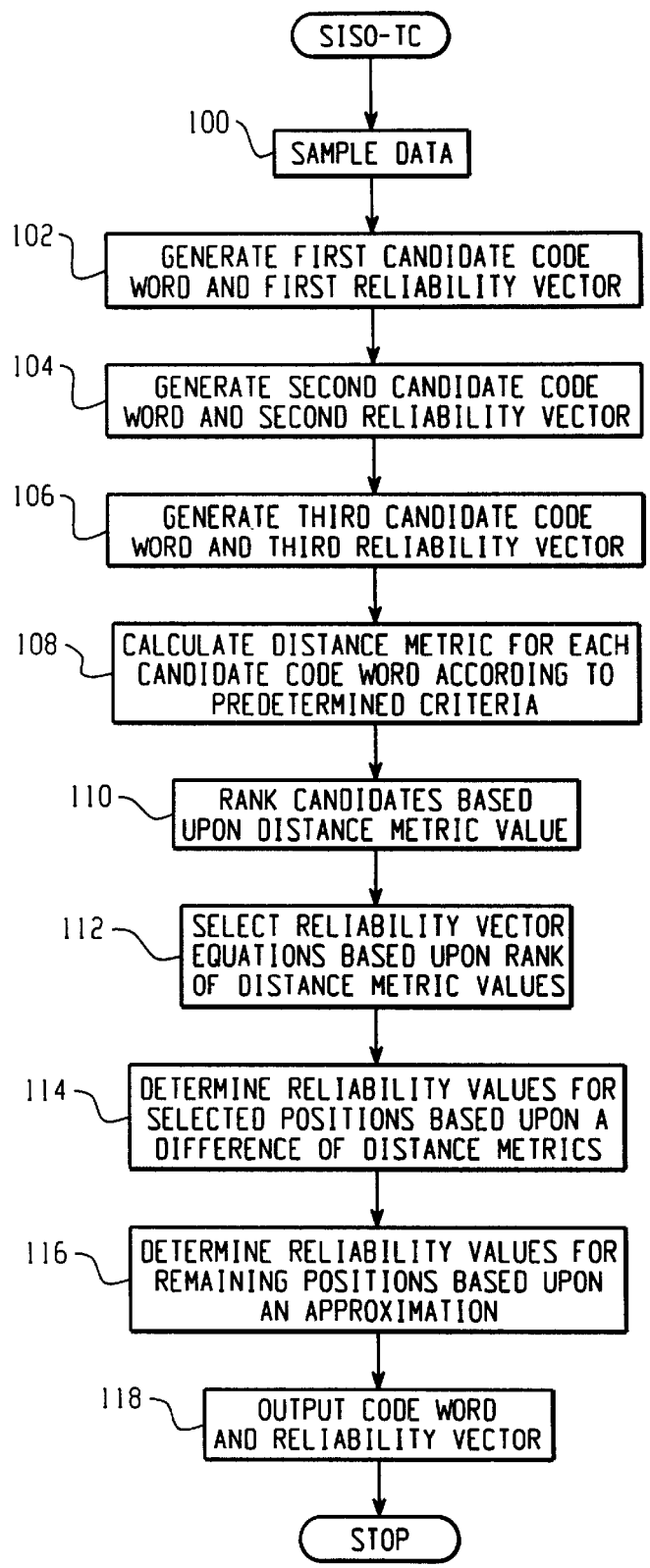
FIG. 1 illustrates a flow chart of the general process of the disclosed SISO-TC algorithm.

Referring now to FIG. 1, there is illustrated a flow chart of the general decoding process of the disclosed SISO-TC algorithm. Flow begins when the destination device decoder samples a vector of data from the data channel, as indicated in a function block 100. Flow continues to a function block 102 where a first candidate code word is generated, along with a companion reliability vector. This first reliability vector is used as an input to subsequent decoding to develop a second candidate code word. The first and second candidate code words and associated reliability vectors are used as an input to a subsequent decoding to develop a third candidate code word. A third candidate code word is then generated, as indicated in a function block 106, along with a third reliability vector. There now exist three candidate code words. The second and third candidate code words along with their reliability vectors do not need to be explicitly calculated. It is only necessary to calculate and store how these code words and reliability vectors differ from the first candidate.

Flow continues to a function block 108 to determine the distance metrics associated with each candidate code word. The code words are then ranked based upon the values of the distance metrics, as indicated in a function block 110. In accordance with the rank of the distance metrics, a predetermined set of output reliability vector equations are then chosen, as indicated in a function block 112. In accordance with the chosen set of reliability equations, selected positions of the output reliability vector are determined based upon a difference of distance metrics, as indicated in a function block 114. For the remaining positions of the reliability vector, an approximation calculation is used, as indicated in a function block 116. Flow continues to a function block 118 where the resulting code word and corresponding reliability vector are output. The process then reaches a stopping point.

Decoding Method No. 1

Figure 2:
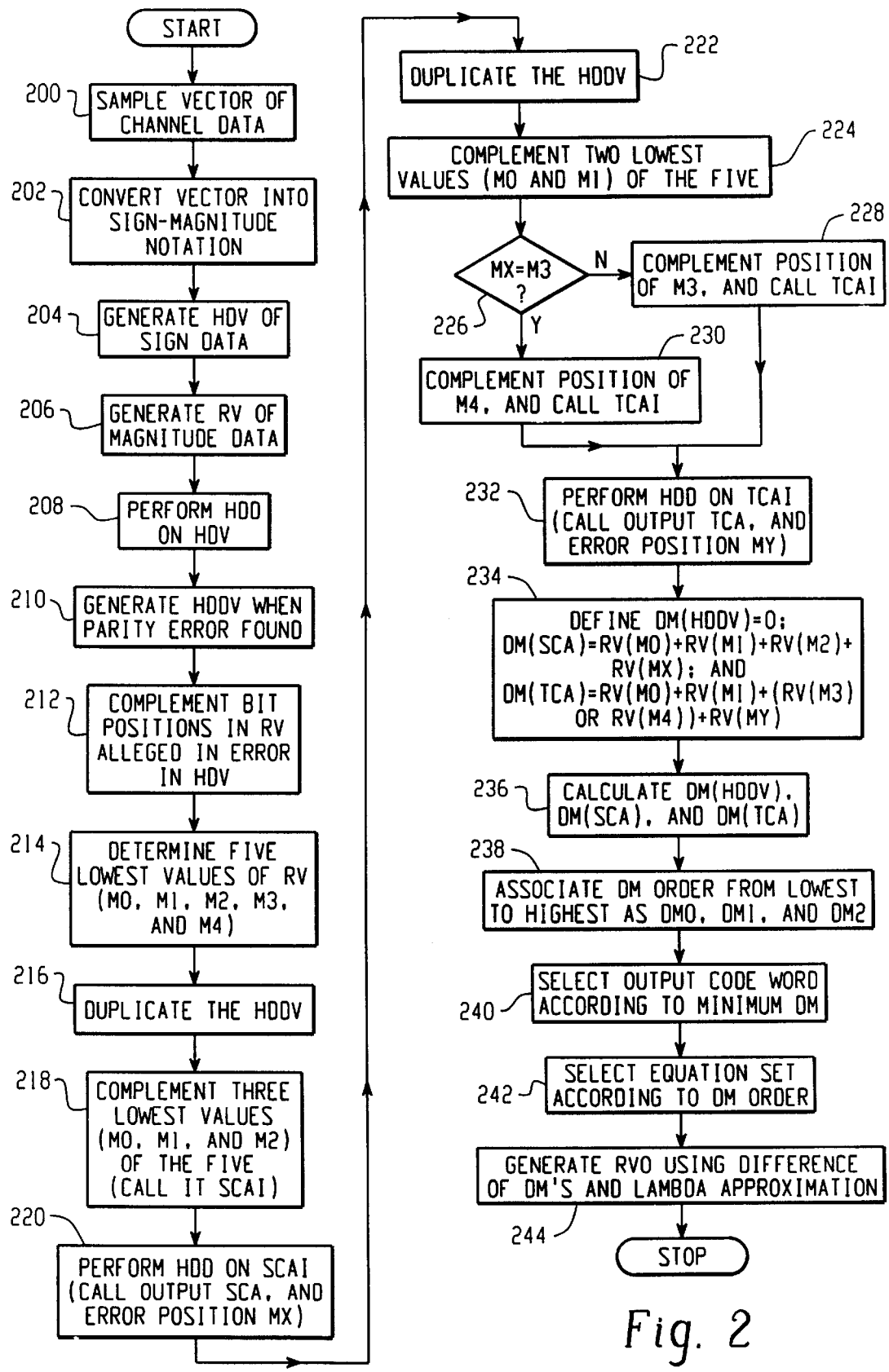
FIG. 2 illustrates a flow chart of one method of decoding, according to a disclosed embodiment.

Referring now to FIG. 2, there is illustrated a flow chart of one method of decoding, according to a disclosed embodiment. The decoding algorithm begins with a function block 200 where a vector of channel data is sampled from a channel of information. The size (or number of bits) of the sampled vector data is determined in accordance with the particular coding implementation. The sampled data, in as much as it is sampled from the physical medium in a bipolar voltage format, is then converted into sign-magnitude notation, as indicated in a function block 202. (Note that implementations in 2's complement can be achieved as well.) Flow continues to a function block 204 where the sign data is extracted and placed into a new vector called a hard decision vector (HDV). Magnitude data of the received vector bits is placed into another vector called a reliability vector (RV), as indicated in a function block 206.

The following decoding steps are explained with respect to a (16,11) Extended Hamming code, but can be applied to all Hamming codes. Extensions can be made to codes having a greater Hamming distance including, but not limited to, for example, BCH (Bose, Chaudhuri, Hocquenghem) codes and Golay codes.

The decoding steps for SISO decoding of the (16,11) Extended Hamming code continue by performing hard decision decoding (HDD) on the HDV, as indicated in a function block 208. The disclosed decoding algorithm must force decoding of the HDV to a code word, which can be accomplished with Extended Hamming codes by complementing the extended bit position (i.e., the appended parity bit) whenever a parity error is found. This resulting "corrected" vector is then designated the Hard Decision Decoded Vector (HDDV), as indicated in a function block 210. Flow continues to a function block 212 where the bit positions of the RV which correspond to the alleged bits in error in the HDV, are then 2's complemented in the RV (i.e., these corresponding bit positions in the RV are negated, if any errors were alleged in these bit positions in the HDDV.) Flow continues to a function block 214 to determine the positions of the five lowest values in the RV. Note that the number of lowest values is determined in accordance the minimum distance of the code being used. There is not a hard-and-fast rule, but it is preferred to be one more then the minimum distance of the code. Thus for Extended Hamming codes, this number is 4+1, or 5. (The bit positions found in blocks 208 and 210 are guaranteed to be part of these five positions.) Call these positions M0, M1, M2, M3, and M4, corresponding in order of lowest to highest values found.

A copy of the HDDV is then made, as indicated in a function block 216, and the bit positions of the three lowest values M0, M1, and M2 of the five (M0–M4) are then complemented, as further indicated in a function block 218. This new vector is designated the Second Chance Algorithm Input (SCAI) vector. Flow continues to a function block 220 where HDD is performed on the SCAI vector. The code word output from this HDD process is designated the SCA (Second Chance Algorithm). The bit positions alleged to be in error by the hard decision decoding (one bit position is guaranteed to be found for extended Hamming codes) are the noted. This bit position alleged to be in error is then denoted as MX. Flow continues to a function block 222 where a copy of the HDDV is made. The bit positions of the two lowest values M0 and M1 are then complemented, as indicated in a function block 224. Flow is to a decision block 226 to determine if MX is equal to M3. If so, flow is out the "Y" path to a function block 228 to complement position M4. This vector is then designated the Third Chance Algorithm Input (TCAI) vector. If MX is not equal to M3, bit position M3 is complemented (i.e., negated) instead of bit position M4, and the vector is designated, again, the TCAI vector, as indicated in a function block 230. Flow is then to a function block 232 to perform HDD on the TCAI vector. The output code word is designated the Third Chance Algorithm (TCA) vector, and the positions alleged to be in error in the HDD process are noted (one bit error is guaranteed to be found). This new error position is denoted MY.

At this point, there exists three candidate code words (or vectors); HDDV, SCA, and TCA. Each code word has a distance metric (DM) associated therewith. The DM for the HDDV code word is denoted DM(HDDV), and similarly for DM(SCA) and DM(TCA). The following definitions are then made, as indicated in a function block 234: DM(HDDV)=0; DM(SCA)=RV(M0)+RV(M1)+RV(M2)+RV(MX); and DM(TCA)=RV(M0)+RV(M1)+(RV(M3) or RV(M4), per the procedure of blocks 222–230, meaning blocks 222, 224, 226, 228, and 230)+RV(MY).

Flow continues to a function block 236 where DM(HDDV), DM(SCA), and DM(TCA) are calculated, ranked from the lowest to highest value, and assigned to DM0, DM1, and DM2, respectively, as indicated in a function block 238. Flow continues to a function block 240 where the output vector (HDDV, SCA, or TCA) which has a minimum DM, is chosen. (Note that bit positions M0 and M1 each may be a negative value due to the 2's complementing.) Flow is then to a function block 242 where the appropriate set of equations are selected for determining the output reliability vector RVO according to the order of the distance metrics DM0, DM1, and DM2. The RVO is then generated using a difference of distance metrics (DM0, DM 1, and DM2) for some of the bit positions, and by using a lambda approximation for the remaining positions, as indicated by a function block 244. Flow then continues to a Stop block. At this point, flow could return processing of the decoding algorithm to function block 200 to process the next sampled data vector.

Selection of output reliability vector (RVO) is then determined in accordance with the relationship of the candidate code word DM's.

a) If the minimum (or lowest value) distance metric DM0=DM(HDDV), and the $2^{nd}$ minimum distance metric DM1=DM(SCA), then:
RVO(M0)=DM1–DM0=DM(SCA)–DM(HDDV)=RV(M0)+RV(M1)+RV(M2)+RV(MX);
RVO(M1)=DM1–DM0=DM(SCA)–DM(HDDV)=RV(M0)+RV(M1)+RV(M2)+RV(MX);
RVO(M2)=DM1–DM0=DM(SCA)–DM(HDDV)=RV(M0)+RV(M1)+RV(M2)+RV(MX);
RVO(MX)=DM1–DM0=DM(SCA)–DM(HDDV)=RV(M0)+RV(M)+RV(M2)+RV(MX);
RVO(M3 or M4, per blocks 226–230)=DM2-DM0=DM(TCA)–DM(HDDV)=RV(M0)+RV(M1)+(RV(M3) or RV(M4), per the procedure of blocks 222–230)+RV(MY); (Note that depending upon how the decoding progresses, MX could be M3, or M4, or something else. If it is, then that one of M3 or M4 becomes part of SCA, and the other one becomes part of TCA. If MX is neither M3 or M4, then M3 becomes part of TCA; but M4 is only part of TCA if MY=M4.)
RVO(MY)=DM2-DM0=DM(TCA)–DM(HDDV)=RV(M0)+RV(M1)+(RV(M3) or RV(M4), per the procedure of blocks 222–230)+RV(MY); and
RVO(J)=RV(M0)+RV(M1)+RV(J)+λRV(M4)–DM0, where J is all other positions.

b) If the minimum distance metric is DM0=DM(HDDV), and the $2^{nd}$ minimum distance metric is DM1=DM(TCA), then:
RVO(M0)=DM1–DM0=DM(TCA)–DM(HDDV)=RV(M0)+RV(M1)+(RV(M3) or RV(M4), per the procedure of blocks 222–230)+RV(MY);
RVO(M1)=DM1–DM0=DM(TCA)–DM(HDDV)=RV(M0)+RV(M1)+(RV(M3) or RV(M4), per the procedure of blocks 222–230)+RV(MY); RVO(M2)=DM2-DM0=DM(SCA)–DM(HDDV)=RV(M0)+RV(M1)+RV(M2)+RV(MX);
RVO(MX)=DM2-DM0=DM(SCA)–DM(HDDV)=RV(M0)+RV(M1)+RV(M2)+RV(MX);
RVO(M3 or M4, per blocks 226-230)=DM1–DM0=DM(TCA)–DM(HDDV)=RV(M0)+RV(M1)+(RV(M3) or RV(M4), per the procedure of blocks 222–230)+RV(MY);
RVO(MY)=DM1–DM0=DM(TCA)–DM(HDDV)=RV(M0)+RV(M1)+(RV(M3) or RV(M4), per the procedure of blocks 222–230)+RV(MY); and
RVO(J)=RV(M0)+RV(M1)+RV(J)+λRV(M4)–DM0, where J is all other positions.

c) If the minimum distance metric DM0=DM(SCA), and the $2^{nd}$ minimum distance metric DM1=DM(HDDV), then:
RVO(M0)=DM1–DM0=DM(HDDV)–DM(SCA)=–RV(M0)–RV(ML)–RV(M2)–RV(MX);
RVO(M1)=DM1–DM0=DM(HDDV)–DM(SCA)=–RV(M0)–RV(M1)–RV(M2)–RV(MX);
RVO(M2)=DM1–DM0=DM(HDDV)–DM(SCA)=–RV(M0)–RV(M)–RV(M2)–RV(MX);
RVO(MX)=DM1–DM0=DM(HDDV)–DM(SCA)=–RV(M0)–RV(M)–RV(M2)–RV(MX);
RVO(M3 or M4, per blocks 226–230)=DM2-DM0=DM(TCA)–DM(SCA);
RVO(MY)=DM2-DM0=DM(TCA)–DM(SCA); and
RVO(J)=RV(J)+λRV(M4)–RV(M2)–RV(MX), where J is all other positions.

d) If the minimum distance metric DM0=DM(SCA), and the $2^{nd}$ minimum distance metric DM1=DM(TCA), then:
RVO(M0)=DM2-DM0=DM(HDDV)–DM(SCA)=–RV(M0)–RV(M1)–RV(M2)–RV(MX);
RVO(M1)=DM2-DM0=DM(HDDV)–DM(SCA)=–RV(M0)–RV(M1)–RV(M2)–RV(MX);
RVO(M2)=DM1–DM0=DM(TCA)–DM(SCA)=(RV(M3) or RV(M4), per the procedure of blocks 222–230)+RV(MY)–RV(M2)–RV(MX);
RVO(MX)=DM1–DM0=DM(TCA)–DM(SCA)=(RV(M3) or RV(M4), per the procedure of blocks 222–230)+RV(MY)–RV(M2)–RV(MX);
RVO(M3 or M4, per blocks 222–230)=DM1–DM0=DM(TCA)–DM(SCA);
RVO(MY)=DM1–DM0=DM(TCA)–DM(SCA); and
RVO(J)=RV(J)+λRV(M4)–RV(M2)–DM(MX), where J is all other positions.

e) If the minimum distance metric DM0=DM(TCA), and the $2^{nd}$ minimum distance metric DM1=DM(HDDV), then:
RVO(M0)=DM1–DM0=DM(HDDV)–DM(TCA)=–RV(M0)–RV(ML)–(RV(M3) or RV(M4), per the procedure of blocks 222–230)–RV(MY);
RVO(M1)=DM1–DM0=DM(HDDV)–DM(TCA)=–RV(M0)–RV(M)–(RV(M3) or RV(M4), per the procedure of blocks 222–230)–RV(MY);
RVO(M2)=DM2-DM0=DM(SCA)–DM(TCA)=RV(M2)+RV(MX)–(RV(M3) or RV(M4), per the procedure of blocks 222–230)–RV(MY);
RVO(MX)=DM2-DM0=DM(SCA)–DM(TCA)=RV(M2)+RV(MX)–(RV(M3) or RV(M4), per the procedure of blocks 222–230)–RV(MY);
RVO(M3 or M4, per blocks 226-230)=DM1–DM0=DM(HDDV)–DM(TCA) =–RV(M0)–RV(M1)–(RV(M3) or RV(M4), per the procedure of blocks 222–230)–RV(MY);
RVO(MY)=DM1–DM0=DM(HDDV)–DM(TCA)=–RV(M0)–RV(M1)–(RV(M3) or RV(M4), per the procedure of blocks 222–230)–RV(MY); and
RVO(J)=RV(J)+λRV(M4)–(RV(M3) or RV(M4), per the procedure of blocks 222–230)–RV(MY), where J is all other positions.

f) If the minimum distance metric DM0=DM(TCA), and the $2^{nd}$ minimum distance metric DM1=DM(SCA), then:

RVO(M0)=DM2−DM0=DM(HDDV)−DM(TCA)=−RV(M0)−RV(M1)−(RV(M3) or RV(M4)), per the procedure of blocks 222–230)−RV(MY);

RVO(M1)=DM2−DM0=DM(HDDV)−DM(TCA)=−RV(M0)−RV(M1)−(RV(M3) or RV(M4)), per the procedure of blocks 222–230)−RV(MY);

RVO(M2)=DM1−DM0=DM(SCA)−DM(TCA)=RV(M2)+RV(MX)−(RV(M3) or RV(M4)), per the procedure of blocks 222–230)−RV(MY);

RVO(MX)=DM1−DM0=DM(SCA)−DM(TCA)=RV(M2)+RV(MX)−(RV(M3) or RV(M4)), per the procedure of blocks 222–230)−RV(MY);

RVO(M3 or M4, per blocks 226–230)=DM1−DM0=DM(SCA)−DM(TCA);

RVO(MY)=DM1−DM0=DM(SCA)−DM(TCA); and

RVO(J)=RV(J)+λRV(M4)−(RV(M3) or RV(M4)), per the procedure of blocks 222–230)−RV(MY), where J is all other positions.

The constant λ is a multiplying constant which is determined by trial and error. A method for arriving at the estimation parameter is described in greater detail hereinbelow. A range of values of λ from λ=2 to λ=7, inclusive, has been found to yield good results for many Hamming codes and Extending Hamming Codes with 5 bits of channel soft information (5 bits of quantization). Clearly, using only one additional decoding instead of two, would work, albeit at a reduced performance (SCA only). Extensions to a $4^{th}$ and $5^{th}$ decoding pass, and beyond, are possible.

For codes with higher minimum distances, the technique can be made to work, however, the choice of alternate code word patterns needs to be determined.

(16,11) Extended Hamming Code Example

The following example addresses a scenario where two errors are introduced into the transmitted vector s, and will be discussed in conjunction with the steps illustrated in the flow chart of FIG. 2. Let the (16,11) code word which will be transmitted across the channel be the binary vector t=(1 1 1 0 0 1 1 1 0 1 0 1 0 0 1 1). Voltage conversion of the binary symbols of the binary vector t results in a transmitted vector s being the following:

$$s=(+1\ +1\ +1\ -1\ -1\ +1\ +1\ +1\ -1\ +1\ -1\ +1\ -1\ -1\ +1\ +1).$$

Channel noise e introduced into the transmitted vector s results in a noisy received word r having errors in bit positions one and three (from the left, and underlined). If the noisy received vector r, with errors in bit positions one and three, has the following voltages representing the corresponding bit positions of the transmitted vector s, the noisy received vector r, as sampled in accordance with the step in function block 200, could be the following:

(−0.1, +1.1, −0.2, −0.9, −1.3, +1.2, +0.4, +1.0, −0.9, +1.7, −1.1, +0.3, −1.5, −1.1, +0.9, +0.7).

The noisy received vector r is then converted into two vectors: the HDV and the RV, as indicated in function block 202. The HDV, as before, is derived from the sign data of the noisy received vector r, as indicated in function block 204, and forms the following binary vector which inserts a zero bit for a negative value in the noisy received vector r, and a one bit for a positive value:

HDV=(0 1 0 0 0 1 1 1 0 1 0 1 0 0 1 1).

The RV is derived from the absolute value of the symbol voltages of the noisy received vector r, as indicated in function block 206, and becomes:

RV=(0.1, 1.1, 0.2, 0.9, 1.3, 1.2, 0.4, 1.0, 0.9, 1.7, 1.1, 0.3, 1.5, 1.1, 0.9, 0.7).

The next step is to perform hard decision decoding on the HDV, and designate the output code word as HDDV, as indicated in function block 208. This process uses the parity bits to find and correct the binary errors. The (16,11) code word has a minimum Hamming distance of four, which means that any two code words are different in at least four bit positions. Since there are 11-bit messages, there are $2^{11}$ (or 2048) possible transmitted code words. There are $2^{16}$ possible received HDVs. If an HDV is different from one of the 2048 code words by only one bit position (or it is an exact match), then the resulting HDDV is defined to be that one HDV code word. In a practical implementation, finding the "closet" code word is found by recomputing the parity bits, and testing the block of recomputed parity bits with the block of original parity bits. If there is agreement, there are no errors in the HDV, therefore, HDDV=HDV. If there is no agreement, the positions in disagreement can be used to compute the location of the error. One error can be detected and corrected. Two errors can be detected, but not corrected with any reliability, since there are sixteen code words having a distance two from any double-error HDV. The mapping of parity bits which do not agree (also called the syndrome) to the "alleged" error pattern can be accomplished via a look-up table. An exemplary HDDV could then be the following:

HDDV=HDD(HDV)=(0 1 0 0 0 1 0 1 0 1 0 1 0 0 1 0).

In this example, hard decision decoding of the HDV alleged additional errors in positions 7 and 16, and "corrected" these positions by converting them to zero bits. Now the HDDV has a total of four bits in error, i.e., positions 1, 3, 7 and 16. Note that the disclosed algorithm requires that HDDV must be a code word, thus, when HDD of the HDV is performed, the result will be forced to a code word. Therefore, the HDDV is a code word.

In accordance with the step associated with function block 212 of FIG. 2, the two positions in the RV which correspond to the erroneous bit positions (7 and 16) of the HDV, are now 2's complemented, which in a binary regime, is a convenient way of representing negative numbers. Therefore, corresponding reliability values in the RV at positions alleged to be in error by HDD (positions 7 and 16) are replaced with negative values. Let RVe be this augmented RV, such that RVe=RV(HDDV), and is represented by the following vector:

RVe=(0.1 1.1 0.2 0.9 1.3 1.2 −0.4 1.0 0.9 1.7 1.1 0.3 1.5 1.1 0.9 −0.7).

HDDV and RVe are now consistent with HDV and RV, respectively, since bits were changed in the HDDV, and corresponding reliability values in RVe were made negative. (Note that a logical 1 with reliability X is equivalent to a logical 0 with reliability −X.)

In accordance with the step associated with function block 214, the positions in the augmented vector RVe having the five lowest values are denoted M0, M1, M2, M3, and M4, in ascending order. These five lowest values are associated, in ascending order, with positions 16, 7, 1, 3, and 12. Therefore, M0=−0.7, M1=−0.4, M2=+0.1, M3=+0.2, and M4=+0.3. The five lowest values are selected based upon the distance structure of the code. This turns out to be five for all Extended Hamming codes, from (8,4) to (256,247), and beyond.

In accordance with function block 216, the HDDV is then duplicated in preparation for complementing the three lowest values (M0, M1, and M2), and denoting the resulting vector the SCAI vector, as indicated in function block 218. The complemented positions are underlined.

HDDV (complemented)=SCAI=($\underline{1}$ 1 0 0 0 1 $\underline{1}$ 1 0 1 0 1 0 0 1 $\underline{1}$).

In accordance with function block 220, the next step is to perform HDD on the SCAI, and denote the resulting vector SCA. Hard decision decoding will allege one error (e.g., in position three) since it is an Extended Hamming code. The position in error is then denoted MX. Therefore, the SCA vector is:

SCA=HDD(SCAI)=(1 1 $\underline{1}$ 0 0 1 1 1 0 1 0 1 0 0 1 1).

Notice that the resulting SCA code word is the transmitted binary code word t. Position 3 (underlined) is alleged to be in error. Also note that for Extended Hamming codes, hard decision coding of the SCAI will always allege one, and only one position, in error. This is a nice property of Extended Hamming codes, but it is not the case for codes with higher minimum distances, in general.

The positions of the two lowest values (M0 and M1) are then complemented in a copy of the HDDV, as indicated in function block 224.

HDDV (M0 and M1 complemented)=(0 1 0 0 0 $\underline{1}$ $\underline{1}$ 0 1 0 1 0 0 1 $\underline{1}$)

As indicated hereinabove, the two lowest positions M0 and M1 occur at positions 16 and 7, respectively. A third lowest position is needed. Since position 3 is already tagged as MX, M3 cannot be used, since it too is pointing to position 3. So the position having the next larger value is selected, the position associated with tag M4, or in this case position 12. If the step associated with function block 214 had found something other then position 3, then position 3 could have been used for the third lowest value position. The position associated with the selected third position is then complemented (shown underlined), resulting in the following vector, denoted TCAI:

TCAI=HDDV(M4 complemented)=(0 1 0 0 0 1 1 1 0 1 0 $\underline{1}$ 0 0 1 1).

Hard decision decoding is then performed on TCAI, as indicated in function block 232, and will allege one position in error, since the code word is an Extended Hamming code word, e.g., position 14 (shown underlined), resulting in a vector denoted TCA:

TCA=(0 1 0 0 0 1 1 1 0 1 0 0 0 1 $\underline{1}$ 1).

This alleged error position will, of course, depend on the code structure itself, and position 14 is just an example. It may be almost anywhere, but will not be positions 16, 7, 1, or the third position used (position 12). Because the step of function block 214 found position 3, position 3 will not be alleged in error. (Note that the positions alleged to be in error in the steps associated with blocks 220, 222, 224, 226, 228, and 230, are guaranteed to be different). Note also that HDDV is a code word. If three positions are complemented, HDD can only find one more position (HDD could in theory find two, but if it did, the result would not satisfy the overall parity condition, so the HDD process will find one, and only one, position). This position must be different from the first three in order to obtain a total of four positions different.

HDD is then performed on the TCAI vector, as indicated in function block 232, and the resulting output vector is denoted TCA. Note that one position is guaranteed to be in error, and this error position is denoted MY.

TCA=HDD(TCAI)=(0 1 0 0 0 1 1 1 0 1 0 0 0 $\underline{1}$ 1 1)

Summarizing to this point, there are three candidate code words (i.e., vectors) called HDDV, SCA, and TCA, and the augmented reliability vector RVe.

HDDV=HDD(HDV)=(0 1 0 0 0 1 0 1 0 1 0 1 0 0 1 0);

SCA=HDD(SCAI)=(1 1 1 0 0 1 1 1 0 1 0 1 0 0 1 1);

TCA=HDD(TCAI)=(0 1 0 0 0 1 1 1 0 1 0 0 0 1 1 1); and

RVe=(0.1, 1.1, 0.2, 0.9, 1.3, 1.2, −0.4, 1.0, 0.9, 1.7, 1.1, 0.3, 1.5, 1.1, 0.9, −0.7).

Additionally, a number of bit positions have been tagged; M0(position 16)=−0.7, M1(position 7)=−0.4, M2(position 1)=+0.1, M3(position 3)=+0.2, M4(position 12 )=+0.3, MX(position 3)=+0.2 and MY(position 14)=1.1.

As noted hereinabove, each code word has distance metrics (DM) associated therewith. As indicated in function block 234, the DM for HDDV is denoted DM(HDDV), similarly DM(SCA), and DM(TCA), and each are calculated in accordance with the previous definitions (as further indicated in function block 236), as follows: DM(HDDV)= 0; DM(SCA)=RV(M0)+RV(M1)+RV(M2)+RV(MX)=−0.7− 0.4+0.1+0.2=−0.8; and DM(TCA)=RV(M0)+RV(M1)+(RV (M3) or RV(M4), as per function block 214)+RV(MY)=− 0.7−0.4+0.3+1.1=0.3.

The distance metrics DM(SCA), DM(HDDV), and DM(TCA) are then ranked in ascending order from the lowest value to the highest value, and assigned the respective designators DM0, DM1, and DM2, from lowest to highest priority, as indicated in function block 238. In this case, DM0=DM(SCA)=−0.8; DM1=DM(HDDV)=0; and DM2=DM(TCA)=+0.3.

In accordance with the step of function block 240, the chosen output vector is that which has the minimum DM (note that M0 and M1 may be negative values). Determination of the output reliability vector (RVO) is made by arriving at the reliability measure for each of the six different bits: M0, M1, M2, MX, M3 or M4, MY, and all other bits J. In this particular example, the third scenario is used, since DM(SCA) is the minimum distance metric, and DM(HDDV) is the $2^{nd}$ minimum distance metric.

RVO(M0, i.e., bit 16)=DM1−DM0=DM(HDDV)−DM (SCA)=0−(−0.8)=+0.8;

RVO(M1, i.e., bit 7)=DM1−DM0=DM(HDDV)−DM (SCA)=0−(−0.8)=+0.8;

RVO(M2, i.e., bit 1)=DM1−DM0=DM(HDDV)−DM (SCA)=0−(−0.8)=+0.8;

RVO(MX, i.e., bit 3)=DM1−DM0=DM(HDDV)−DM (SCA)=0−(−0.8)=+0.8;

RVO(M3 or M4, as per function block 214 which is M4, i.e., bit 12, in this case) =DM2 −DM1=DM(TCA)−DM (HDDV)=0.3;

RVO(MY, i.e., bit 14)=DM2−DM1=DM(TCA)−DM (HDDV)=0.3; and

RVO(J)=RV(M0)+RV(M1)+RV(J)+λRV(M4)−DM0 (where J is all other bit positions)=(−0.7)+(−0.4)+RV(J)+λ(0.3)− (−0.8)=−0.3+RV(J).

Completing the example by calculating the output reliabilities for the remaining bit positions yields the following values for all bits (where hereinafter RVO(bit 1) is denoted RVO(1)):

RVO(bit 1)=+0.8;
RVO(bit 2)=−0.3+RV(2)=−0.3+1.1=+0.8;
RVO(bit 3)=+0.8;
RVO(bit 4)−0.3+RV(4)=−0.3−0.9=−1.2;
RVO(bit 5)=−0.3+RV(5)=−0.3−1.3=−1.6;
RVO(bit 6)=−0.3+RV(6)=−0.3+1.2=+0.9;
RVO(bit 7)=+0.8;
RVO(bit 8)=−0.3+RV(8)=−0.3+1.0=+0.7;
RVO(bit 9)=−0.3+RV(9)=−0.3−0.9=−1.2;
RVO(bit 10)=−0.3+RV(10)=−0.3+1.7=+1.4;
RVO(bit 11)=−0.3+RV(11)=−0.3−1.1=−1.4;
RVO(bit 12)=+0.3;
RVO(bit 13)=−0.3+RV(13)=−0.3−1.5=−1.8;
RVO(bit 14)=+0.3;
RVO(bit 15)=−0.3+RV(15)=−0.3+0.9=+0.6; and
RVO(bit 16)=+0.8.

The output code word is the code word with the maximum correlation or minimum metric, which in this example is SCA. Thus the output code word of this example, i.e., (1, 1, 1, 0, 0, 1, 1, 1, 0, 1, 0, 1, 0, 0, 1, 1) matches the transmitted code word at the beginning of the example.

(8,4) Extended Hamming Code Example

In an application using a (7,4) Hamming code, a 4-bit binary message is to be sent from a source device to a destination device across a channel medium. As part of the encoding scheme of the source device, three parity check bits are appended to the 4-bit message prior to transmission across the channel. Each of the parity check bits generated at the source encoder are calculated in accordance with a number of predetermined algebraic equations, each involving a combination of one or more of the message bits. When a vector of data is sampled at the destination decoder, these same algebraic equations are then used to, again, regenerate the parity bits in accordance with the received message bits, and to compare these regenerated parity bits with the parity bits of the received message. When a difference in parity bits is found, the SISO-TC algorithm executes to resolve the errors in favor of the most-likely-transmitted code word. If a code word was received at the destination, no parity errors will be detected, implying that no problem existed in the transmission process, and calculation of the output reliability information is all that remains.

However, 8-bit code words or multiples thereof are more conducive to existing communication systems. Therefore, Extended Hamming codes (e.g., (8,4), (16,11), etc.) are used which include an additional appended parity check bit to check overall parity of the 7-bit (7,4) code word. Continuing with the (8,4) Extended Hamming code application, if what is to be transmitted from the source device is the all-zeros binary word 0 0 0 0 0 0 0 0, the four leftmost bits are message (or information) bits, and the source encoder adds the four rightmost bits for parity checking. In preparation for transmission across the channel to the destination device, each binary symbol of the all-zeros word is converted into a voltage (e.g., a logical 1 is transmitted as a +1 volt, and a logical 0 is transmitted as a −1 volt). Voltage representation of the all-zeros word which is to be transmitted to the destination device is −1.0, −1.0, −1.0, −1.0, −1.0, −1.0, −1.0, −1.0 (commas are added for clarity). During transmission over the data channel, noise is induced into the voltages.

Assume that what is to be transmitted is the binary word 0 0 0 0 0 0 0 0, with four leftmost bits of message (or information), and four rightmost parity bits. In preparation for transmission across the channel to the destination device, each binary symbol of the all-zeros word is converted into a voltage (e.g., a logical 1 is transmitted as a +1 volt, and a logical 0 is transmitted as a −1 volt). Assume that the received 8-bit code word, in voltage notation, is the following: −0.9 −1.1 −0.8 −1.2 +0.2 +0.1 −1.1 −1.0. Note that the two underlined positions (positions 5 and 6, from the left) are in error, since the positive voltages ultimately translate into two binary "1" bits, which are different from the corresponding zero bits of the transmitted all-zeros binary code word. This is the basis for further discussion hereinbelow. Note also that since these two symbol voltages are the closest to zero of all of the eight symbol voltages (i.e., the "minimum" absolute values), they are the most suspect for being incorrect. That is, the introduction of noise from the channel during transmission is more likely to have caused these two bit positions to toggle from the correct binary value to the incorrect binary value.

After receipt of the voltage vector, two vectors are generated; the HDV, called the "hard information," and the RV, called the "soft information" or the "reliability information." The HDV is generated from each of the symbol polarities, where a positive voltage maps to a binary "1" and a negative voltage maps to a binary "0," resulting in an 8-bit binary received code word of β=0 0 0 0 1 1 0 0. Note that word β has two bit errors relative to the transmitted binary word, which errors are in the positions of the "1" bits. The RV is generated using the magnitude of the voltages associated with each of the symbol positions. Therefore, the RV is 0.9, 1.1, 0.8, 1.2, 0.2, 0.1, 1.1, 1.0 (the commas inserted for clarity, only).

Next, HDD is performed on the binary code word β (i.e., HDV). Assuming that HDD of the HDV results in two additional bit positions being in error (positions 3 and 4), the resulting 8-bit binary code word is 0 0 1 1 1 1 0 0. This occurs since the regime in which this particular decoding example is applied, operates on a code having a minimum distance of four (i.e., every code word must differ from every other code word by at least four positions). Since the all-zeros code word is also a code word, then any code word which is not the all-zeros code word must have at least four "1" bits. Note that the hard decision decoder can correct a single bit error, however, it can only take a guess at a two bit-error event. In this case, only two bit positions will be toggled (i.e., the decoder will toggle 0, 1 or 2 positions only, and never more then two, in this example). It is not possible to start with two 1s, and toggle two positions, and have the result be a code word, unless the two positions which are toggled are completely outside the original, channel-caused, two bits in error. It is possible that the guess is indeed these two original erroneous bits (in which case the guess is right and the errors are corrected), but it is much more likely that the decoder "added" two more "errors," resulting in a code word with four "1" bits, or a code word which differs from the transmitted code word in four positions. The SISO-TC algorithm then negates the positions (3 and 4) in the RV of those alleged error positions in the HDV, which is called the augmented error RV, or RVe. The RVe is now 0.9, 1.1, −0.8, −1.2, 0.2, 0.1, 1.1, 1.0.

Taking a brief departure at this point to discuss some inherent features of linear block codes will be informative. The (8,4) Extended Hamming code is based upon the (7,4) Hamming code. To arrive at the (8,4) Extended Hamming code, a single parity bit (for checking overall parity) is appended to the (7,4) Hamming code. An inherent aspect of a (7,4) linear block code is that hard decision decoding of such a code will result in another code word. This aspect is carried into the (8,4) Extended Hamming code when, after decoding the (7,4) word, overall parity is checked, and the appended parity bit is "corrected" if necessary to meet the overall parity condition. Additionally, the (8,4) Extended Hamming Code has a minimum distance of four; that is, each code word in the set of code words differs from one another in at least four bit positions.

Continuing with the example, before analyzing code words other than the first possible code word, the bit positions alleged to be in error by HDD, positions 3 and 4, are tagged for later reversal.

At this point, other code words need to be found and tested. Assume that the first code word (generated by the HDD decoder) is incorrect, or that the HDD failed to find the correct code word. From the previous arguments, it is known that the positions alleged to be in error by the HDD, are most likely correct. Therefore, look for the second code word to be different from the first code word, in these alleged error positions. Note also that these positions have negative values in the RVe vector.

To find the second code word, three conditions need to be satisfied: (1) a code word needs to be found which differs from the first code word in four positions; (2) this code word needs to have a high probability of being the correct code word; and (3) the search must be performed such that the four positions which are toggled result in a code word (i.e., just any four positions can not be toggled).

The algorithm continues by finding the positions of the three lowest values in the augmented reliability vector RVe. These positions are then toggled. At this point, the new binary vector is run through a hard decision decoder (HDD). The HDD will find a fourth position. (It is possible to find this fourth position simply by knowing the positions of the three lowest values which are to be toggled. Thus, the HDD operation on the new binary vector would not be necessary). This operation generates a code word which is different from the first code word in four positions, thus meeting condition (1). Because three of the positions are the positions of lowest value in RVe, the probability of finding the correct code word is maximized, thus meeting condition (2). At this point, there exists only one other position which can be toggled to result in a code word (condition (3)). To find this last position, the new bit pattern (first code word with three positions toggled) is passed through the hard decision decoder. This decoder will allege an "error," which error will be the missing $4^{th}$ position, thus, meeting conditions (1) and (3). (Note that to find this $4^{th}$ position, one could have started with the all-zeros code word, toggled the three positions of the three lowest confidences values, and passed this bit pattern through a hard decision decoder. This process has some advantages in implementation.) Having the four positions, the second code word is the first code word with the four positions toggled.

To find a third code word, an assumption has to be made that the first code word is not the transmitted code word, and the second code word is not the transmitted code word. The third code word is found by generating a code word which is different from the first in four positions, and different from the second in four positions. Of the four positions toggled in finding the second code word, the two positions with the lowest confidence values in RVe are retained. A third position which has the lowest confidence in RVe is then found, but it is not one of the remaining two positions of the four positions toggled in finding the second code word. A bit pattern now exists which is different from the first code word in three positions. This bit pattern is then passed through a hard decision decoder to find the missing "$4^{th}$" position. The resulting code word is guaranteed to be different from the first code word in four positions, and the second code word in four positions. (Notice that, in general, the five lowest values in RVe need to be found.)

Continuing with the example, recall the received real-valued vector is as follows:

$$-0.9\ -1.1\ -0.8\ -1.2\ \underline{+0.2}\ \underline{+0.1}\ -1.1\ -1.0.$$

The HDV is a binary word having logical 1s and 0s according to the respective symbol position polarities, and the RV is comprised of the symbol position magnitudes, both indicated as follows:

$$HDV = 0\ 0\ 0\ 0\ 1\ 1\ 0\ 0$$

and $$RV = 0.9\ 1.1\ 0.8\ 1.2\ \underline{0.2}\ \underline{0.1}\ 1.1\ 1.0.$$

After hard decision decoding, the results are:

$$HDD(HDV) = HDDV = 0\ 0\ 1\ 1\ 1\ 1\ 0\ 0$$

and $$RVe = 0.9\ 1.1\ -0.8\ -1.2\ \underline{0.2}\ \underline{0.1}\ 1.1\ 1.0$$

For the second code word, the locations of the three lowest values in RVe are positions three, four, and six.

| | RVe = | 0.9 | 1.1 | −0.8 | −1.2 | 0.2 | 0.1 | 1.1 | 1.0 |
|---|---|---|---|---|---|---|---|---|---|
| (lowest values →) | | | | ↑ | ↑ | | ↑ | | |

To find the $4^{th}$ position, place 1s in these positions of an otherwise all-zeros vector, resulting in:

$$0\ 0\ 1\ 1\ 0\ 1\ 0\ 0.$$

Passing this word through a hard decision decoder will allege position five in error. Thus, the second code word SCA is HDD with positions three, four, five, and six, toggled.

$$SCA = 0\ 0\ 0\ 0\ 0\ 0\ 0\ 0$$

For the third code word, keep the positions of the two lowest values in RVe, and find the $3^{rd}$ lowest without considering the two highest of the four of finding the second code word.

| | RVe = | 0.9 | 1.1 | −0.8 | −1.2 | 0.2 | 0.1 | 1.1 | 1.0 |
|---|---|---|---|---|---|---|---|---|---|
| (two lowest values →) | | | | ↑ | ↑ | | | | |
| (previously considered →) | | | | | | ↑ | ↑ | | |

Positions five and six cannot be looked at, since these were already considered in the second code word. The next lowest value is in position one (i.e., 0.9).

To find the $4^{th}$ position, place is in these three positions (1, 3, and 4) of an otherwise all-zeros vector:

$$1\ 0\ 1\ 1\ 0\ 0\ 0\ 0.$$

Pass this word through a hard decision decoder, which will then allege position two in error (in this example). Thus, the third code word TCA is hard decision decoded with positions one, two, three, and four toggled, that is:

TCA=1 1 1 1 0 0 0 0.

Correlation, or a metric substantially equivalent to correlation (such as the "difference metric" method in Bill's Dissertation, and which simplifies the calculation significantly) is used to choose among these three code words. The "correlation value" is the correlation between the real-valued vector RV and each candidate code word (in −1/+1 notation). The correlation is calculated as the sum of the products of the respective positions of the output code word and its corresponding position in the received real-valued vector. The first candidate code word was HDDV (i.e., 0 0 1 1 1 1 0 0), which in −1/+1 notation is, −1 −1 +1 +1 +1 +1 −1 −1. The received was −0.9 −1.1 −0.8 −1.2 +0.2 +0.1 −1.1 −1.0.

CV(HDDV)=−1(−0.9)−1(−1.1)+1(−0.8)+1(−1.2)+1(0.2)+1(0.1)−1(−1.1)−1(−1.0)=2.4

CV(SCA)=−1(−0.9)−1(−1.1)−1(−0.8)−1(−1.2)−1(0.2)−1(0.1)−1(−1.1)−1(−1.0)=5.8

CV(TCA)=1(−0.9)+1(−1.1)−1(−0.8)−1(−1.2)+1(0.2)+1(0.1)−1(−1.1)−1(−1.0)=2.4

The maximum correlation value (i.e., 5.8) is for the second candidate code word (SCA). Therefore, the output code word is the all-zeros code word SCA.

Output=SCA=0 0 0 0 0 0 0 0.

The output reliability for each bit of the output code word SCA is the difference in correlation values between the output code word SCA, and the code word which has a different value in the corresponding bit position. The output reliability for the first position is defined as the difference between CV(SCA) and CV(TCA)=5.8−2.4=3.4, since SCA was the chosen code word, and TCA is the code word which would have had to been chosen for the first bit position to be different (a logical 1). It so happens that this is also the output reliability for the second position as well, and for the same reason. So the first two bit positions of the output reliability vector (RVO) can be filled in with these two values, as follows:

+3.4 +3.4 ? ? ? ? ? ?

The output reliability of the third position is the difference between CV(SCA) and CV(HDDV), since SCA was the chosen code word, and HDDV is the code word which would have had to been chosen for the third bit position to be different (a logical 1). This is also the output reliability for the fourth position as well, and for the same reason. So positions three and four of the output reliability vector RVO can be filled in as follows:

+3.4 +3.4 +3.4 +3.4 ? ? ? ?

To find the output reliability of positions five and six, the difference between the correlation value of the chosen code word, and the correlation value of one of the code words not chosen, is used. Both of these code words are different in positions five and six. If a code word had to be chosen which was different in position five (or six), that code word with the highest correlation of the remaining two would be chosen. Of the two remaining code words, it so happens that, in this example, both have a correlation value of 2.4. So, HDDV or TCA could be chosen. In either case, the output reliability for positions five and six is 5.8−2.4=3.4. So positions five and six of the output reliability vector RVO can be filled in as follows:

RVO=+3.4 +3.4 +3.4 +3.4 +3.4 +3.4 ? ?

The output reliability of the $7^{th}$ and $8^{th}$ positions are calculated differently. There are no code words which "suggest" a one in either of these positions. So the output reliability vector RVO is computed as follows:

$$RVO(\text{position } 7) = CV(SCA) - PseudoCV(\text{of a code word with position 7, which doesn't exist})$$
$$= CV(SCA) - (CV(SCA) - 2(-RVe(M2) + -RVe(MX) - RVe(7) - \lambda RVe(M4)))$$
$$= 2(-RVe(M2) + -RVe(MX) - RVe(7) - \lambda RVe(M4))$$
$$= 2(-0.1 + -0.2 + 1.1 + \lambda(0.9)) = 1.6 + 1.8\lambda;$$

and, $$RVO(\text{position } 8) = CV(SCA) - PseudoCV(\text{of a code word with position 8, which doesn't exist})$$
$$= CV(SCA) - (CV(SCA) - 2(-RVe(M2) + -RVe(MX) + -RVe(8) - \lambda RVe(M4)))$$
$$= 2(-RVe(M2) + -RVe(MX) + -RVe(8) - \lambda RVe(M4))$$
$$= 2(-0.1 + -0.2 + 1.0 + \lambda(0.9)) = 1.4 + 1.8\lambda.$$

In an alternative embodiment, if $\lambda RVe(M4)$ is replaced by gamma ($\gamma$), then RVO(position 7)=2(−0.1 +−0.2 +1.1+γ)=1.6+2γ

RVO(position 8)=2(−0.1 +−0.2 +1.0+γ)=1.4+2γ, where γ is a fixed parameter found by simulation. If γ is set to one (in the range of what is typical for this example), then:

RVO(7)=3.6

RVO(8)=3.4 so,

RVO=+3.4 +3.4 +3.4 +3.4 +3.4 +3.4 +3.6 +3.4, and the output code word is:

0 0 0 0 0 0 0 0.

Extensions Favorable to the Iterative Decoding Process

When decoding is performed in an iterative design, very often the output needs to be modified. Subsequent "same axis" decodings tend to be correlated. This correlation reduces the performance of the concatenated code. To eliminate (or at least significantly reduce) this problem, the output soft information is replaced with the output minus the input. This can be done explicitly, however, since the output for any position J has the input (RV(J)) as one of the terms making up the output. This "subtract-off-the-input" property can be incorporated into the SISO soft output calculation itself to reduce the overall complexity (i.e., there is no need to add numbers which will subsequently be subtracted off).

Decoding Method No. 2

Figure 3:
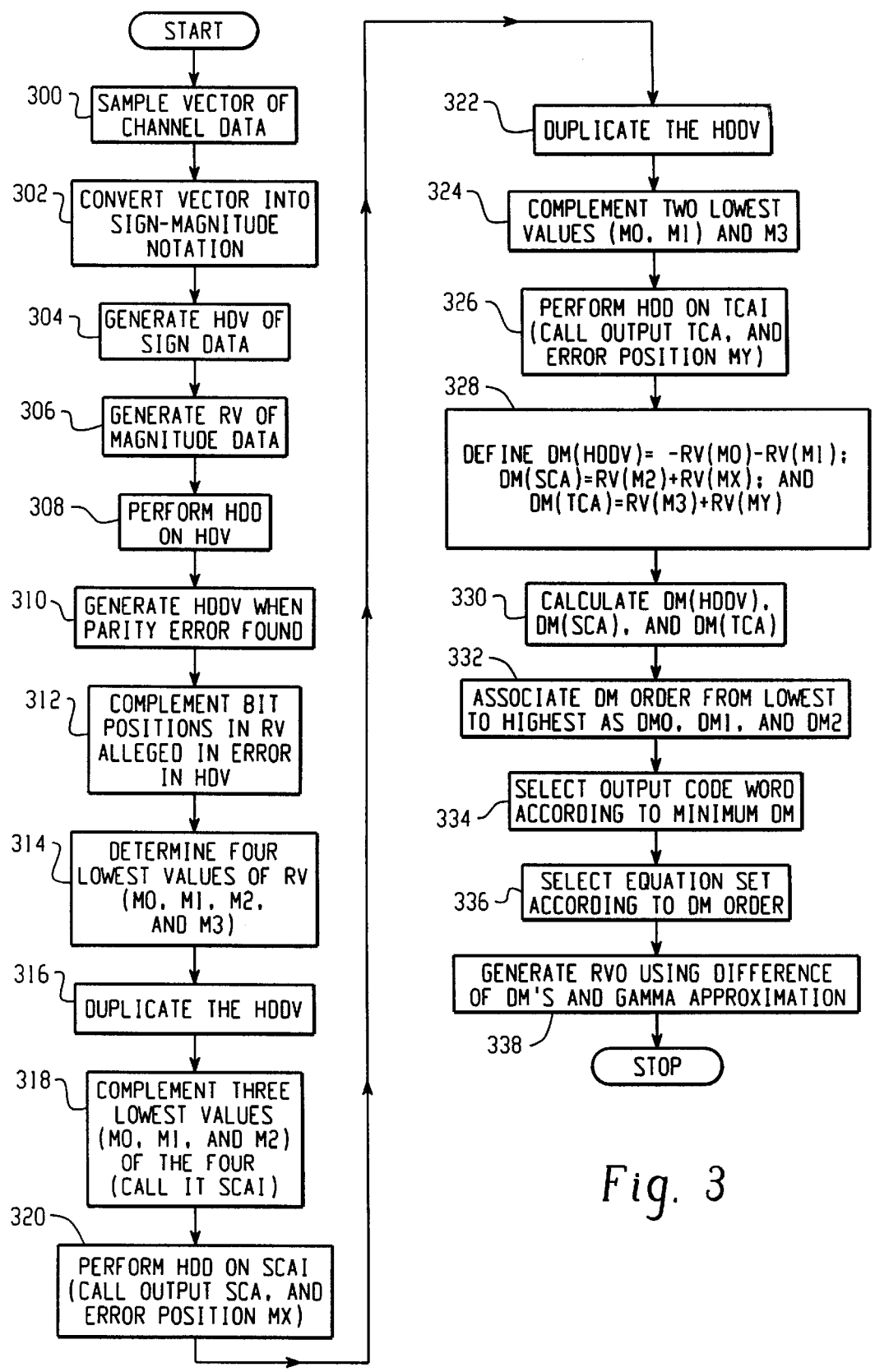
FIG. 3 illustrates a flow chart of a second decoding method, according to a disclosed embodiment.

Referring now to FIG. 3, there is illustrated a flow chart of a second decoding method, according to a disclosed embodiment. This method exploits the fact that in turbo decoding, where typically many iterations are performed, the desired output information is the difference of the SISO input and SISO output. The reason for this is that there is a correlation in the output data to the input data which tends to cause the iterative process to converge too rapidly, and often incorrectly. By subtracting the SISO input from the SISO output, only the difference is used. The difference is scaled, and then added with the original vector. The resulting "array" is the input to the next decoding pass. This keeps the decoding process from converging erroneously. Additionally, given that the desired result is the SISO output minus the SISO input, the difference can be computed directly, saving two steps, i.e., the difference is not added in to calculate the SISO output, so the addition step is eliminated, plus any subsequent subtraction steps. The decoding algorithm begins with a function block 300 with a vector of sampled channel data. The size (or number of bits) of the sampled vector data is determined in accordance with the particular coding implementation, for example, if (8,4) block codes are used, the sampled vector will include four samples for each of the four bits of information and samples for each of the four bits of parity checking. The sampled data, in as much as it is sampled from the physical medium in a bipolar voltage format, is then converted into sign-magnitude notation, as indicated in a function block 302. (Note that implementations in 2's complement can be achieved as well.) Flow continues to a function block 304 where the sign data is extracted and placed into the new HDV. Magnitude data of the received vector is placed into the RV, as indicated in a function block 306.

The following decoding steps are explained with respect to a (16,11) extended Hamming code, but can be applied to all extended Hamming codes. Extensions can be made to codes having a greater Hamming distance including, but not limited to, BCH codes and Golay codes. The decoding steps for SISO decoding of the (16,11) extended Hamming code continue by performing HDD on the HDV, as indicated in a function block 308. The disclosed decoding algorithm must force decoding of the HDV to another code word. This is accomplished with extended Hamming codes by complementing the extended bit position (i.e., the parity bit) whenever a parity error is found. This resulting "corrected" vector is again, designated the HDDV, as indicated in a function block 310. Flow continues to a function block 312 where the bit positions of the RV which correspond to the alleged bits in error in the HDV, are then 2's-complemented in the RV. (Note that these corresponding bit positions in the RV are negated, if any errors were alleged in the HDDV.) Flow continues to a function block 314 to determine the positions of the four lowest values in the RV. (The positions found in accordance with the step associated with block 312 are guaranteed to be part of these four positions.) Call these positions M0, M1, M2, and M3 in order of lowest to highest values, respectively.

A copy of the HDDV is then made, as indicated in a function block 316, and the bit positions of the three lowest values M0, M1, and M2 of the four (M0-M3) are then complemented, as further indicated in a function block 318. This new vector is designated the SCAI vector. Flow continues to a function block 320 where HDD is performed on the SCAI vector. The code word output from this HDD process is designated the SCA vector. Note the bit position alleged to be in error by the hard decision decoding (one bit position is guaranteed to be found for extended Hamming codes). This bit position alleged to be in error is then denoted as MX. Flow continues to a function block 322 where a copy of the HDDV is made. The bit positions of the two lowest values M0 and M1 are then complemented, as indicated in a function block 324. Additionally, complement bit position M3. This vector is than designated the TCAI vector. Flow is then to a function block 326 to perform HDD on the TCAI vector. The output code word is designated the TCA vector, and the positions alleged to be in error in the hard decision decoding process are noted (one bit error is guaranteed to be found). This new error position is denoted as MY.

At this point, there exists three candidate code words (or vectors); HDDV, SCA, and TCA. (Note that TCA may be equal to SCA, if MX=M3 and MY=M2, in which case, TCA would be excluded.). Each code word has a DM associated therewith. The DM for the HDDV code word is denoted DM(HDDV), and similarly for DM(SCA) and DM(TCA). The following definitions are then made, as indicated in a function block 328: DM(HDDV)=−RV(M0)−RV(M1); DM(SCA)=RV(M2)+RV(MX); and DM(TCA)=RV(M3)+RV(MY).

Flow continues to a function block 330 where DM(HDDV), DM(SCA), and DM(TCA) are calculated, ranked from the lowest to highest value, and assigned to DM0, DM1, and DM2, respectively, as indicated in a function block 332. Flow continues to a function block 334 where the output vector (HDDV, SCA, or TCA) which has minimum DM, is chosen. (Note that M0 and M1 may be negative values.) Flow is then to a function block 336 where the appropriate set of equations are selected for determining the output reliability vector RVO, according to the order of the distance metrics DM0, DM1, and DM2. The RVO is then generated using a difference of distance metrics (DM0, DM1, and DM2) for some of the bit positions, and by using a gamma approximation for the remaining positions, as indicated by a function block 338. Flow then continues to a Stop block. At this point, flow could return processing of the decoding algorithm to function block 300 to process the next sampled data vector.

Selection of RVO is then determined in accordance with the relationship of the candidate code word DM's.

a) If the minimum distance metric DM0=DM(HDDV), and the $2^{nd}$ minimum distance metric DM1=DM(SCA), then:

$$RVO(M0) = DM1 - DM0 = DM(SCA) - DM(HDDV)$$

$$= RV(M2) + RV(MX) + RV(M0) + RV(M1);$$

$$RVO(M1) = DM1 - DM0 = DM(SCA) - DM(HDDV)$$

$$= RV(M2) + RV(MX) + RV(M0) + RV(M1);$$

$$RVO(M2) = DM1 - DM0 = DM(SCA) - DM(HDDV)$$

$$= RV(M2) + RV(MX) + RV(M0) + RV(M1);$$

$$RVO(MX) = DM1 - DM0 = DM(SCA) - DM(HDDV)$$

$$= RV(M2) + RV(MX) + RV(M0) + RV(M1);$$

$$RVO(M3) = DM2 - DM0 = DM(TCA) - DM(HDDV)$$

$$= RV(M3) + RV(MY) + RV(M0) + RV(M1);$$

$$RVO(MY) = DM2 - DM0 = DM(TCA) - DM(HDDV)$$

$$= RV(M3) + RV(MY) + RV(M0) + RV(M1); \text{ and}$$

b) If the minimum distance metric DM0=DM(HDDV), and the $2^{nd}$ minimum distance metric DM1=DM(TCA), then:

$$RVO(M0) = DM1 - DM0 = DM(TCA) - DM(HDDV)$$
$$= RV(M3) + RV(MY) + RV(M0) + RV(M1);$$
$$RVO(M1) = DM1 - DM0 = DM(TCA) - DM(HDDV)$$
$$= RV(M3) + RV(MY) + RV(M0) + RV(M1);$$
$$RVO(M2) = DM2 - DM0 = DM(SCA) - DM(HDDV)$$
$$= RV(M2) + RV(MX) + RV(M0) + RV(M1);$$
$$RVO(MX) = DM2 - DM0 = DM(SCA) - DM(HDDV)$$
$$= RV(M2) + RV(MX) + RV(M0) + RV(M1);$$
$$RVO(M3) = DM1 - DM0 = DM(TCA) - DM(HDDV)$$
$$= RV(M3) + RV(MY) + RV(M0) + RV(M1);$$
$$RVO(MY) = DM1 - DM0 = DM(TCA) - DM(HDDV)$$
$$= RV(M3) + RV(MY) + RV(M0) + RV(M1); \text{ and}$$

c) If the minimum distance metric DM0=DM(SCA), and the $2^{nd}$ minimum distance metric DM1=DM(HDDV), then:

$$RVO(M0) = DM1 - DM0 = DM(HDDV) - DM(SCA)$$
$$= -RV(M0) - RV(M1) - RV(M2) - RV(MX);$$
$$RVO(M1) = DM1 - DM0 = DM(HDDV) - DM(SCA)$$
$$= -RV(M0) - RV(M1) - RV(M2) - RV(MX);$$
$$RVO(M2) = DM1 - DM0 = DM(HDDV) - DM(SCA)$$
$$= -RV(M0) - RV(M1) - RV(M2) - RV(MX);$$
$$RVO(MX) = DM1 - DM0 = DM(HDDV) - DM(SCA)$$
$$= -RV(M0) - RV(M1) - RV(M2) - RV(MX);$$
$$RVO(M3) = DM2 - DM0 = DM(TCA) - DM(SCA)$$
$$= RV(M3) + RV(MY) - RV(M2) - RV(MX);$$
$$RVO(MY) = DM2 - DM0 = DM(TCA) - DM(SCA)$$
$$= -RV(M3) + RV(MY) - RV(M2) - RV(MX); \text{ and}$$

d) If the minimum distance metric DM0=DM(SCA), and the $2^{nd}$ minimum distance metric DM1=DM(TCA), then:

$$RVO(M0) = DM2 - DM0 = DM(HDDV) - DM(SCA)$$
$$= -RV(M0) - RV(M1) - RV(M2) - RV(MX);$$
$$RVO(M1) = DM2 - DM0 = DM(HDDV) - DM(SCA)$$
$$= -RV(M0) - RV(M1) - RV(M2) - RV(MX);$$
$$RVO(M2) = DM1 - DM0 = DM(TCA) - DM(SCA)$$
$$= RV(M3) + RV(MY) - RV(M2) - RV(MX);$$
$$RVO(MX) = DM1 - DM0 = DM(TCA) - DM(SCA)$$
$$= RV(M3) + RV(MY) - RV(M2) - RV(MX);$$
$$RVO(M3) = DM1 - DM0 = DM(TCA) - DM(SCA)$$
$$= RV(M3) + RV(MY) - RV(M2) - RV(MX);$$
$$RVO(MY) = DM1 - DM0 = DM(TCA) - DM(SCA)$$
$$= RV(M3) + RV(MY) - RV(M2) - RV(MX); \text{ and}$$

e) If the minimum distance metric DM0=DM(TCA), and the $2^{nd}$ minimum distance metric DM1=DM(HDDV), then:

$$RVO(M0) = DM1 - DM0 = DM(HDDV) - DM(TCA)$$
$$= -RV(M0) - RV(M1) - RV(M3) - RV(MY);$$
$$RVO(M1) = DM1 - DM0 = DM(HDDV) - DM(TCA)$$
$$= -RV(M0) - RV(M1) - RV(M3) - RV(MY);$$
$$RVO(M2) = DM2 - DM0 = DM(SCA) - DM(TCA)$$
$$= RV(M2) + RV(MX) - RV(M3) - RV(MY);$$
$$RVO(MX) = DM2 - DM0 = DM(SCA) - DM(TCA)$$
$$= RV(M2) + RV(MX) - RV(M3) - RV(MY);$$
$$RVO(M3) = DM1 - DM0 = DM(HDDV) - DM(TCA)$$
$$= -RV(M0) - RV(M1) - RV(M3) - RV(MY);$$
$$RVO(MY) = DM1 - DM0 = DM(HDDV) - DM(TCA)$$
$$= -RV(M0) + RV(M1) - RV(M3) - RV(MY); \text{ and}$$

f) If the minimum distance metric DM0=DM(TCA), and the $2^{nd}$ minimum distance metric DM1=DM(SCA), then:

$$RVO(M0) = DM2 - DM0 = DM(HDDV) - DM(TCA)$$
$$= -RV(M0) - RV(M1) - RV(M3) - RV(MY);$$
$$RVO(M1) = DM2 - DM0 = DM(HDDV) - DM(TCA)$$
$$= -RV(M0) - RV(M1) - RV(M3) - RV(MY);$$
$$RVO(M2) = DM1 - DM0 = DM(SCA) - DM(TCA)$$
$$= RV(M2) + RV(MX) - RV(M3) - RV(MY);$$
$$RVO(MX) = DM1 - DM0 = DM(SCA) - DM(TCA)$$
$$= RV(M2) + RV(MX) - RV(M3) - RV(MY);$$
$$RVO(M3) = DM1 - DM0 = DM(SCA) - DM(TCA)$$
$$= RV(M2) + RV(MX) - RV(M3) - RV(MY);$$
$$RVO(MY) = DM1 - DM0 = DM(SCA) - DM(TCA)$$
$$= -RV(M2) + RV(MX) - RV(M3) - RV(MY); \text{ and}$$

The constant $\gamma$ is determined by trial and error. A range of values of $\gamma$'s from $\gamma=5$ to $\gamma=40$ inclusive, has been found to yield good results from many Hamming codes and extended Hamming Codes. Clearly, using only one additional decoding instead of two would work, albeit at a reduced performance. Extensions to a $4^{th}$ and $5^{th}$ pass decoding, and beyond, are possible.

For codes with higher minimum distances, the technique can be made to work. The choice of alternate code word patterns needs to be determined.

Decoding Method No. 3

Figure 4:
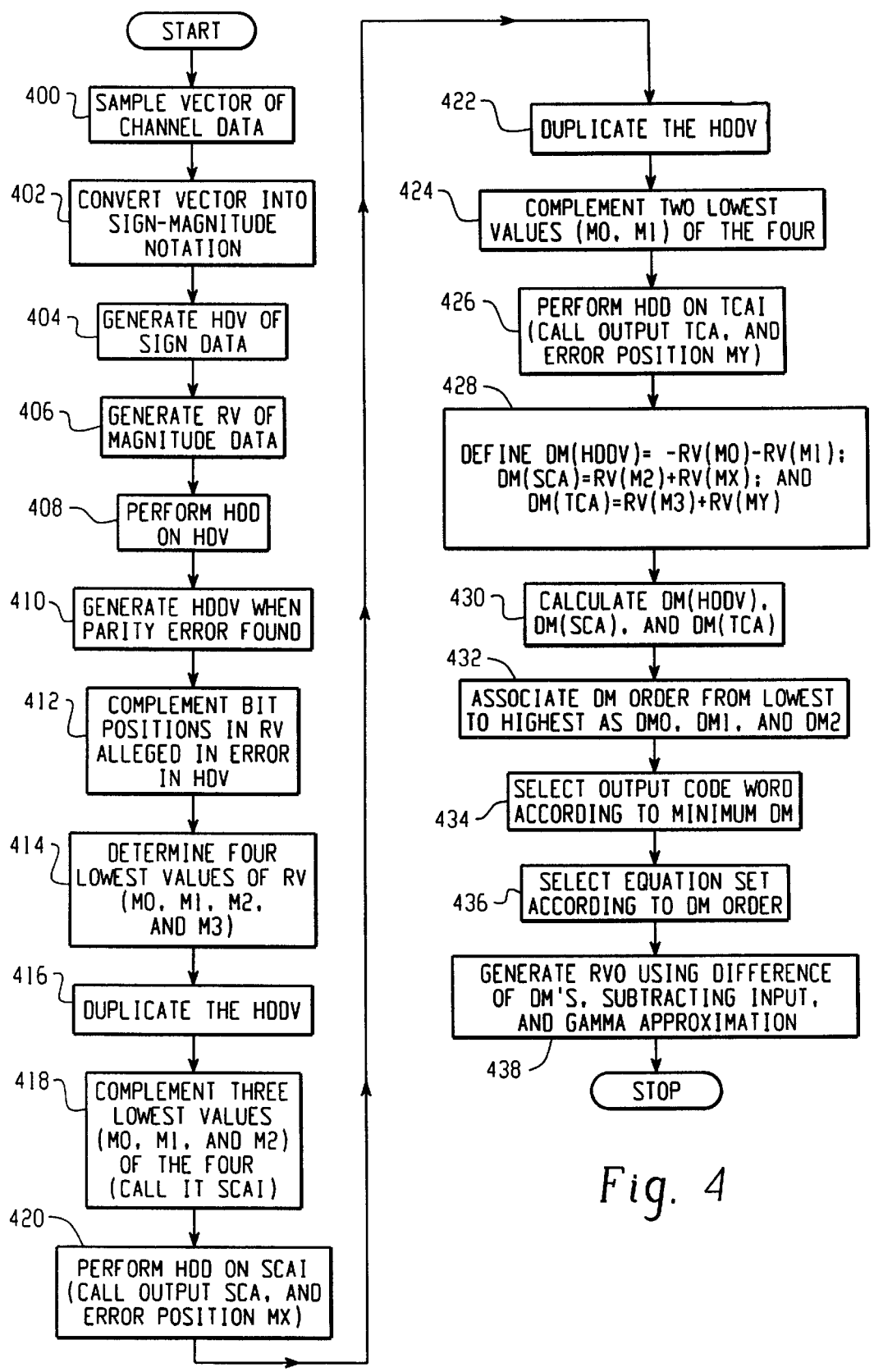
FIG. 4 illustrates a flow chart of a third decoding method, according to a disclosed embodiment.

Referring now to FIG. 4, there is illustrated a flow chart of a third decoding method, according to a disclosed embodiment. The decoding algorithm begins with a function block 400 where a vector of channel data is sampled. The size (or number of bits) of the sampled vector data is determined in accordance with the particular coding implementation, for example, if (8,4) block codes are used, the sampled vector will include four bits of information and four bits of parity checking. The sampled data, in as much as it is sampled from the physical medium in a bipolar voltage format, is then converted into sign-magnitude notation, as indicated in a function block 402. (Note that implementations in 2's complement can be achieved as well.) Flow continues to a function block 404 where the sign data is extracted and placed into the HDV. Magnitude data of the received vector bits is placed into the RV, as indicated in a function block 406.

The following decoding steps are explained with respect to a (16,11) extended Hamming code, but can be applied to all extended Hamming codes. Extensions can be made to include codes having a greater Hamming distance including, but not limited to, BCH codes and Golay codes. The decoding steps for SISO decoding of the (16,11) extended Hamming code continue by performing HDD on the HDV, as indicated in a function block 408. The disclosed decoding algorithm must force decoding of the HDV to another code word. This is accomplished with extended Hamming codes by complementing the extended bit position (i.e., the parity bit) whenever a parity error is found. This resulting "corrected" vector is designated the HDDV, as indicated in a function block 410. Flow continues to a function block 412 where the bit positions of the RV which correspond to the alleged bits in error in the HDV, are then 2's complemented in the RV. (Note that these corresponding bit positions in the RV are negated, if any errors were alleged in the HDDV.) Flow continues to a function block 414 to determine the positions of the four lowest values in the RV. (The positions found in the step associated with function block 408 are guaranteed to be part of these four positions.) Call these positions M0, M1, M2, and M3 in order of lowest to highest values, respectively.

A copy of the HDDV is then made, as indicated in a function block 416, and the bit positions of the three lowest values M0, M1, and M2 of the four (M0–M3) are then complemented, as further indicated in a function block 418. This new vector is designated the SCAI vector. Flow continues to a function block 420 where HDD is performed on the SCAI vector. The code word output from this HDD process is designated the SCA. The bit position alleged to be in error is then noted by the hard decision decoding (one bit position is guaranteed to be found for extended Hamming codes). This bit position alleged to be in error is then denoted as MX. Flow continues to a function block 422 where a copy of the HDDV is made. The bit positions of the two lowest values M0 and M1 are then complemented, as indicated in a function block 424. Additionally, complement bit position M3, and call this vector the TCAI vector. Flow is then to a function block 426 to perform HDD on the TCAI vector. The output code word is designated the TCA vector, and the positions alleged to be in error in the HDD process are noted (one bit error is guaranteed to be found for extended Hamming Codes). This new error position is denoted as MY.

At this point, there exists three candidate code words (or vectors); HDDV, SCA, and TCA (TCA may be equal to SCA, if MX=M3 and MY=M2). Each code word has a distance metric associated therewith. The DM for the HDDV code word is denoted DM(HDDV), and similarly for DM(SCA) and DM(TCA). The following definitions are then made, as indicated in a function block 428: DM(HDDV)=−RV(M0)−RV(M1); DM(SCA)=RV(M2)+RV(MX); and DM(TCA)=RV(M3)+RV(MY). If, however, M3=MX, then there is no TCA vector, and the third code word is excluded.

Flow continues to a function block 430 where DM(HDDV), DM(SCA), and DM(TCA) are calculated, ranked from the lowest to highest value, and assigned to DM0, DM1, and DM2, respectively, as indicated in a function block 432. Flow continues to a function block 434 where the output vector which has minimum DM (HDDV, SCA, or TCA), is chosen. (Note that M0 and M1 may be a negative value.) Flow is then to a function block 436 where the appropriate set of equations are selected for determining the output reliability vector RVO, according to the order of the distance metrics DM0, DM1, and DM2. The RVO is then generated using a difference of distance metrics (DM0, DM1, and DM2), subtracting out the input for some of the bit positions, and using a gamma approximation for the remaining positions, as indicated by a function block 438. Flow then continues to a Stop block. At this point, flow could return processing of the decoding algorithm to function block 400 to process the next sampled data vector.

Selection of RVO is then determined in accordance with the relationship of the candidate code word DM's. The input reliability for any bit position $RV(M?)_{input}$, is the soft information input. That is, the subscript "input" refers to the reliability vector before the HDD process. If the output code word is to result in a bit position being different from the input bit pattern, then this input value must be negated prior to the "subtraction" stage.

a) If the minimum distance metric DM0=DM(HDDV), and the $2^{nd}$ minimum distance metric DM1=DM(SCA), then:

$$RVO(M0) = DM1 - DM0 - RV(M0)_{input} = DM(SCA) - DM(HDDV) - RV(M0)_{input}$$

$$= RV(M2) + RV(MX) + RV(M0) + RV(M1) - RV(M0)_{input}$$

$$= RV(M2) + RV(MX) + RV(M1)$$

$$= RV(M1) + DM(SCA);$$

$$RVO(M1) = DM1 - DM0 - RV(M0)_{input} = DM(SCA) - DM(HDDV) - RV(M1)_{input}$$

$$= RV(M2) + RV(MX) + RV(M0) + RV(M1) - RV(M1)_{input}$$

$$= RV(M2) + RV(MX) + RV(M0)$$

-continued $$= RV(M0) + DM(SCA);$$

$$RVO(M2) = DM1 - DM0 - RV(M2)_{input} = DM(SCA) - DM(HDDV) - RV(M2)_{input}$$

$$= RV(M2) + RV(MX) + RV(M0) + RV(M1) - RV(M2)_{input}$$

$$= RV(MX) + RV(M0) + RV(M1)$$

$$= RV(MX) - DM(HDDV);$$

$$RVO(MX) = DM1 - DM0 - RV(MX)_{input} = DM(SCA) - DM(HDDV) - RV(MX)_{input}$$

$$= RV(M2) + RV(MX) + RV(M0) + RV(M1) - RV(MX)_{input}$$

$$= RV(M2) + RV(M0) + RV(M1)$$

$$= RV(M2) - DM(HDDV);$$

$$RVO(M3) = DM2 - DM0 - RV(M3)_{input} = DM(TCA) - DM(HDDV) - RV(M3)_{input}$$

$$= RV(M3) + RV(MY) + RV(M0) + RV(M1) - RV(M3)_{input}$$

$$= RV(MY) + RV(M0) + RV(M1)$$

$$= RV(MY) - DM(HDDV);$$

$$RVO(MY) = DM2 - DM0 - RV(MY)_{input} = DM(TCA) - DM(HDDV) - RV(MY)_{input}$$

$$= RV(M3) + RV(MY) + RV(M0) + RV(M1) - RV(MY)_{input}$$

$$= RV(M3) + RV(M0) + RV(M1)$$

$$= RV(M3) - DM(HDDV); \text{ and}$$

RVO(J)=γ−DM(HDDV), where J is all other positions.

The general pattern is that the soft input value does not appear in the soft output value calculation for any bit position. In some cases (like M0 and M1), a negative version of the value may be added in. However, in the end, it should always cancel out.

b) If the minimum distance metric DM0=DM(HDDV), and the $2^{nd}$ minimum distance metric DM1=DM(TCA), then:

$$RVO(M0) = DM1 - DM0 - RV(M0)_{input} = DM(TCA - DM(HDDV) - RV - (M0)_{input}$$

$$= RV(M3) + RV(MY) + RV(M0) + RV(M1) - RV(M0)_{input}$$

$$= RV(M3) + RV(MY) + RV(M1);$$

$$RVO(M1) = DM1 - DM0 - RV(M1)_{input} = DM(TCA) - DM(HDDV) - RV(M1)_{input}$$

$$= RV(M3) + RV(MY) + RV(M0) + RV(M1) - RV(M1)_{input}$$

$$= RV(M3) + RV(MY) + RV(M0);$$

$$RVO(M2) = DM2 - DM0 - RV(M2)_{input} = DM(SCA) - DM(HDDV) - RV(M2)_{input}$$

$$= RV(MX) - DM(HDDV);$$

$$RVO(MX) = DM2 - DM0 - RV(MX)_{input} = DM(SCA) - DM(HDDV) - RV(MX)_{input}$$

$$= RV(M2) - DM(HDDV);$$

$$RVO(M3) = DM1 - DM0 - RV(M3)_{input} = DM(TCA) - DM(HDDV) - RV(M3)_{input}$$

$$= RV(MY) - DM(HDDV);$$

$$RVO(MY) = DM1 - DM0 - RV(MY)_{input} = DM(TCA) - DM(HDDV) - RV(MY)_{input}$$

$$= RV(M3) - DM(HDDV); \text{ and}$$

RVO(Y)=γ−DM(HDDV), where J is all other positions.

c) If the minimum distance metric DM0=DM(SCA), and the $2^{nd}$ minimum distance metric DM1=DM(HDDV.), then:

$$RVO(M0) = DM1 - DM0 - RV(M0)_{input} = DM(HDDV) - DM(SCA) - RV(M0)_{input}$$
$$= -RV(M0) - RV(M1) - DM(SCA) - RV(M0)_{input};$$
$$= -RV(M1) - DM(SCA);$$

$$RVO(M1) = DM1 - DM0 - RV(M1)_{input} = DM(HDDV) - DM(SCA) - RV(M1)_{input}$$
$$= -RV(M0) - RV(M1) - DM(SCA) - RV(M1)_{input}$$
$$= -RV(M0) - DM(SCA);$$

$$RVO(M2) = DM1 - DM0 = DM(HDDV) - DM(SCA) - RV(M2)_{input}$$
$$= -RV(M0) - RV(M1) - DM(SCA) + RV(M2)_{input}$$
$$= -RV(M1) - RV(MX) - RV(M0);$$

$$RVO(MX) = DM1 - DM0 - RV(MX)_{input} = DM(HDDV) - DM(SCA) - RV(MX)_{input}$$
$$= -RV(M0) - RV(M1) - DM(SCA) + RV(MX)_{input}$$
$$= -RV(M1) - RV(M2) - RV(M0);$$

$$RVO(M3) = DM2 - DM0 - RV(M3)_{input} = DM(TCA) - DM(SCA) - RV(M3)_{input}$$
$$= RV(M3) + RV(MY) - DM(SCA) - RV(M3)_{input}$$
$$= RV(MY) - DM(SCA);$$

$$RVO(MY) = DM2 - DM0 - RV(MY)_{input} = DM(TCA) - DM(SCA) - RV(MY)_{input}$$
$$= RV(M3) + RV(MY) - DM(SCA) - RV(MY)_{input}$$
$$= RV(M3) - DM(SCA); \quad \text{and}$$

$RVO(J) = \gamma - DM(SCA)$, where J is all other positions.

d) If the minimum distance metric DM0=DM(SCA), and the $2^{nd}$ minimum distance metric DM1=DM(TCA), then:

$$RVO(M0) = DM2 - DM0 - RV(M0)_{input} = DM(HDDV) - DM(SCA) - RV(M0)_{input}$$
$$= -RV(M0) - RV(M1) - DM(SCA) - RV(M0)_{input}$$
$$= -RV(M1) - DM(SCA);$$

$$RVO(M1) = DM2 - DM0 - RV(M1)_{input} = DM(HDDV) - DM(SCA) - RV(M1)_{input}$$
$$= -RV(M0) - RV(M1) - DM(SCA) - RV(M1)_{input}$$
$$= -RV(M0) - DM(SCA) - RV(M1)_{input};$$

$$RVO(M2) = DM1 - DM0 - RV(M2)_{input} = DM(TCA) - DM(SCA) - RV(M2)_{input}$$
$$= RV(M3) + RV(MY) - DM(SCA) - RV(M2)_{input}$$
$$= RV(M3) + RV(MY) - RV(M2) - RV(MX) - RV(M2)_{input}$$
$$= RV(M3) + RV(MY) - RV(MX);$$

$$RVO(MX) = DM1 - DM0 - RV(MX)_{input} = DM(TCA) - DM(SCA) - RV(MX)_{input}$$
$$= RV(M3) + RV(MY) - DM(SCA) - RV(MX)_{input}$$
$$= RV(M3) + RV(MY) - RV(M2) - RV(MX) - RV(MX)_{input}$$
$$= DM(TCA) - RV(M2);$$

$$RVO(M3) = DM1 - DM0 - RV(M3)_{input} = DM(TCA) - DM(SCA) - RV(M3)_{input}$$
$$= RV(M3) + RV(MY) - DM(SCA) - RV(M3)_{input}$$
$$= RV(MY) - DM(SCA);$$

$$RVO(MY) = DM1 - DM0 - RV(MY)_{input} = DM(TCA) - DM(SCA) - RV(MY)_{input}$$
$$= RV(M3) + RV(MY) - DM(SCA) - RV(MY)_{input}$$
$$= RV(M3) - DM(SCA); \text{ and}$$

$RVO(J) = \gamma - DM(SCA)$, where J is all other positions.

e) If the minimum distance metric DM0=DM(TCA), and the $2^{nd}$ minimum distance metric DM1=DM(HDDV), then:

$$RVO(M0) = DM1 - DM0 - RV(M0)_{input} = DM(HDDV) - DM(TCA) - RV(M0)_{input}$$
$$= -RV(M0) - RV(M1) - DM(TCA) - RV(M0)_{input}$$
$$= -RV(M1) - DM(TCA);$$

$$RVO(M1) = DM1 - DM0 - RV(M1)_{input} = DM(HDDV) - DM(TCA) - RV(M1)_{input}$$
$$= -RV(M0) - RV(M1) - DM(TCA) - RV(M1)_{input}$$
$$= -RV(M0) - DM(TCA);$$

$$RVO(M2) = DM2 - DM0 - RV(M2)_{input} = DM(SCA) - DM(TCA) - RV(M2)_{input}$$
$$= RV(M2) + RV(MX) - DM(TCA) - RV(M2)_{input}$$
$$= RV(MX) - DM(TCA);$$

$$RVO(MX) = DM2 - DM0 - RV(MX)_{input} = DM(SCA) - DM(TCA) - RV(MX)_{input}$$
$$= RV(M2) + RV(MX) - DM(TCA) - RV(MX)_{input}$$
$$= RV(M2) - DM(TCA);$$

$$RVO(M3) = DM1 - DM0 - RV(M3)_{input} = DM(HDDV) - DM(TCA) - RV(M3)_{input}$$
$$= -RV(M0) - RV(M1) - DM(TCA) - RV(M3)_{input}$$
$$= -RV(M0) - RV(M1) - RV(M3) - RV(MY) - RV(M3)_{input}$$
$$= DM(HDDV) - RV(MY);$$

$$RVO(MY) = DM1 - DM0 - RV(MY)_{input} = DM(HDDV) - DM(TCA) - RV(MY)_{input}$$
$$= -RV(M0) - RV(M1) - DM(TCA) - RV(MY)_{input}$$
$$= -RV(M0) - RV(M1) - RV(M3) - RV(MY) - RV(MY)_{input}$$
$$= DM(HDDV) - RV(M3); \text{ and}$$

RVO(J)=γ−DM(TCA), where J is all other positions.

f) If the minimum distance metric DM0=DM(TCA), and the $2^{nd}$ minimum distance metric DM1=DM(SCA), then:

$$RVO(M0) = DM2 - DM0 - RV(M0)_{input} = DM(HDDV) - DM(TCA) - RV(M0)_{input}$$
$$= -RV(M0) - RV(M1) - DM(TCA) - RV(M0)_{input}$$
$$= -RV(M1) - DM(TCA);$$

$$RVO(M1) = DM2 - DM0 - RV(M1)_{input} = DM(HDDV) - DM(TCA) - RV(M1)_{input}$$
$$= -RV(M0) - RV(M1) - DM(TCA) - RV(M1)_{input}$$
$$= -RV(M0) - DM(TCA);$$

$$RVO(M2) = DM1 - DM0 - RV(M2)_{input} = DM(SCA) - DM(TCA) - RV(M2)_{input}$$
$$= RV(M2) + RV(MX) - DM(TCA) - RV(M2)_{input}$$
$$= RV(MX) - DM(TCA);$$

$$RVO(MX) = DM1 - DM0 - RV(MX)_{input} = DM(SCA) - DM(TCA) - RV(MX)_{input}$$
$$= RV(M2) + RV(MX) - DM(TCA) - RV(MX)_{input}$$
$$= RV(M2) - DM(TCA);$$

$$RVO(M3) = DM1 - DM0 - RV(M3)_{input} = DM(SCA) - DM(TCA) - RV(M3)_{input}$$
$$= DM(SCA) - DM(TCA) - RV(M3)_{input}$$
$$= DM(SCA) - RV(M3) - RV(MY) - RV(M3)_{input}$$

$$= DM(SCA) - RV(MY);$$

$$RVO(MY) = DM1 - DM0 - RV(MY)_{input} = DM(SCA) - DM(TCA) - RV(MY)_{input}$$

$$= DM(SCA) - DM(TCA) - RV(MY)_{input}$$

$$= DM(SCA) - RV(M3) - RV(MY) - RV(MY)_{input}$$

$$= DM(SCA) - RV(M3); \text{ and}$$

RVO(J)=$\gamma$−DM(TCA), where J is all other positions.

The constant $\gamma$ is a multiplying constant which is determined by trial and error. A range of values of $\gamma$'s from $\gamma$=5 to $\gamma$=40 has been found to yield good results from many Hamming codes and extended Hamming Codes. Clearly, using only one additional decoding instead of two would work, albeit at a reduced performance. Extensions to a $4^{th}$ and $5^{th}$ pass decoding, and beyond, are possible.

For codes with higher minimum distances, the technique can be made to work. However, the choice of alternate code word patterns needs to be determined.

Parameter Estimation

Two parameters, $\lambda$ and $\gamma$, have been discussed in the previous sections. The method of finding these parameters is largely by trial and error. The technique begins with a simulation model of the system. This involves a data source, an encoder, a symbol mapper, a noise-adding process (typically White Gaussian Noise), and a decoder, operating in accordance with the algorithm disclosed hereinabove. All of this can be accomplished in a computer program. Performance evaluation of the decoder (with its respective choice of parameters) is accomplished by comparing the decoded output data with the input data from the data source. The goal is to minimize the percentage of output bits in error for a given noise energy (i.e., average square value of the noise generating process). The best choice of gamma ($\gamma$) is related to the size of the signal as seen at the input of the decoder. A starting value is typically 3 times this value, with smaller values tried until an optimum is reached. A value of $\gamma$=1 to 2 times the average input amplitude has yielded good results. Optimizing lambda ($\lambda$) is less sensitive to the decoder input strength. Lambda in the range of $\lambda$=2 to 5 has yielded good performance.

Those skilled in the art will appreciate that the invention can be carried out entirely in software, in dedicated hardware, or a combination of the two. The specific hardware requirements will be determined by the complexity of the block code being utilized, as well as the particular aspects of the decoding process used. For example, the computing power required to perform the output reliability vector calculations, and the decoding processes, in general, will determine the application format. One approach for carrying out the processes would be the use of address translation logic in conjunction with a general purpose processor. Alternatively, application specific integrated circuits (ASICs) could be designed to execute the functions identified herein with respect to the disclosed algorithms, including address translation logic, vector XOR operations, additions, subtractions and compares. The disclosed novel embodiments could also be implemented into a Field Programmable Gate Array (FPGA) for dedicated use, and many other types of programmable logic devices.

While the invention has been shown and described with respect to specific embodiments thereof, this is for illustrative purposes rather than limitation, and other variations and modifications of the specific embodiments herein shown and described will be apparent to those skilled in the art within the intended spirit and scope of the invention as set forth in the appended claims.

What is claimed is:

1. A method of decoding a channel of data, comprising the steps of:
    sampling a vector of data from the channel of data;
    processing said vector of data to output a final code word of bits; and
    generating a final reliability vector associated with said final code word such that each bit of said final code word of bits has a corresponding reliability value in said final reliability vector, said final reliability vector generated by;
    determining said corresponding reliability value for one or more bit positions of said final code word of bits in accordance with a difference of distance metrics; and
    approximating said corresponding reliability value for one or more bit positions of said final code word of bits in accordance with a numerical approximation.

2. The method of claim 1, wherein said vector of data in the step of sampling is a linear block code of information bits.

3. The method of claim 2, wherein said block code is compatible with one or more block code technologies including Extended Hamming codes, Golay codes, and BCH codes.

4. The method of claim 1, wherein the step of processing is performed iteratively on a plurality of intermediately generated code words to arrive at said final code word.

5. The method of claim 4, wherein there are three of said plurality of intermediately generated code words.

6. The method of claim 4, wherein corresponding intermediate reliability vectors of reliability values are generated in the step of iteratively processing for said plurality of intermediately generated code words.

7. The method of claim 4, wherein the step of iteratively processing further comprises the step of subtracting soft input information from said difference of distance metrics to determine said corresponding reliability value for said one or more bit positions.

8. The method of claim 1, wherein said difference of distance metrics in the step of determining is utilized to determine said reliability values for a number of bit positions which is less than the total number of bit positions of said final code word.

9. The method of claim 1, wherein said difference of distance metrics in the step of determining is utilized to determine said reliability values for a number of bit positions which is one more than the minimum distance associated with a type of block code of said final code word.

10. The method of claim 1, wherein the step of determining further comprises the step of subtracting soft input information from said difference of distance metrics to determine said corresponding reliability value for said one or more bit positions.

11. The method of claim 1, wherein when said corresponding reliability value for select ones of said one or more bit positions are determined according to said difference of distance metrics in the step of determining, said corresponding reliability values for the remaining bits of said final code word of bits are approximated according to the step of approximating.

12. The method of claim 1, wherein the step of processing is performed iteratively on a plurality of intermediately generated code words to arrive at said final code word, such that one of said plurality of intermediately generated code words is determined to have a minimum distance metric associated therewith, and which said minimum distance metric defines said associated intermediately generated code word as said final code word.

* * * * *

UNITED STATES PATENT AND TRADEMARK OFFICE
CERTIFICATE OF CORRECTION

PATENT NO. : 7,117,418 B2
APPLICATION NO. : 09/954698
DATED : October 3, 2006
INVENTOR(S) : William H. Thesling and Sameep Dave It is certified that error appears in the above-identified patent and that said Letters Patent is hereby corrected as shown below:

IN THE SPECIFICATIONS

At column 5, line 45, please replace "(M0)+RM(M)+RV(M2)+RV(MX)" with -- (M0)+RV(M1)+RV(M2)+RV(MX) --.

At column 6, line 1, please add a return between "222-230)+RV(MY);" and "RVO(M2)=DM2-DM0=DM".

At column 6, line 16, please replace "(M0)-RV(ML)-RV(M2)-RV(MX)" with -- (M0)-RV(M1)-RV(M2)-RV(MX) --.

At column 6, line 20, please replace "(M0)-RV(M)-RV(M2)-RV(MX)" with -- (M0)-RV(M1)-RV(M2)-RV(MX) --.

At column 6, line 22, please replace "(M0)-RV(M)-RV(M2)-RV(MX)" with -- (M0)-RV(M1)-RV(M2)-RV(MX) --.

At column 6, line 48, please replace "(M0)-RV(ML)-(RV(M3)" with -- (M0)-RV(M1)-(RV(M3) --.

At column 6, line 51, please replace "(M0)-RV(M)-(RV(M3)" with -- (M0)-RV(M1)-(RV(M3) --.

At column 10, line 23, please replace "M4(position 12 )" with -- M4(position 12) --.

At column 11, line 8, please replace "RVO(bit 4)-0.3+RV(4)=-0.3-0.9=-1.2" with -- RVO(bit 4)=-0.3+RV(4)=-0.3-0.9=-1.2 --.

At column 18, line 23, please replace "330where" with -- 330 where --.

At column 18, line 65, please add -- RVO(J) = RV(J) + γ + RV(M0) + RV(M1), where J is all other positions. -- between "= RV(M3) + RV(MY) + RV(M0) + RV(M1); and" and "b) If the minimum distance metric DM0=DM(HDDV),".

At column 19, line 20, please add -- RVO(J) = RV(J) + γ + RV(M0) + RV(M1), where J is all other positions. -- between "= RV(M3) + RV(MY) + RV(M0) + RV(M1); and" and "c) If the minimum distance metric DM0=DM(SCA), and".

At column 19, line 41, please replace "= -RV(M3)" with -- = RV(M3) --.

UNITED STATES PATENT AND TRADEMARK OFFICE
CERTIFICATE OF CORRECTION

PATENT NO. : 7,117,418 B2  
APPLICATION NO. : 09/954698  
DATED : October 3, 2006  
INVENTOR(S) : William H. Thesling and Sameep Dave It is certified that error appears in the above-identified patent and that said Letters Patent is hereby corrected as shown below:

At column 19, line 43, please add -- $RVO(J) = RV(J) + \gamma - RV(M2) - RV(MX)$, where J is all other positions. -- above the line "d) If the minimum distance metric DM0=DM (SCA), and".

At column 19, line 65, please add -- $RVO(J) = RV(J) + \gamma - RV(M2) - RV(MX)$, where J is all other positions. -- between "=RV(M3) + RV(MY) - RV(M2) - RV(MX); and " and "e) If the minimum distance metric DM0=DM(TCA), and".

At column 20, line 19, please replace "= -RV(M0) + RV(M1)" with -- = -RV(M0) - RV(M1) --.

At column 20, line 20, please add -- $RVO(J) = RV(J) + \gamma - RV(M3) - RV(MY)$, where J is all other positions. -- above the line "f) If the minimum distance metric DM0=DM (TCA), and".

At column 20, line 41, please replace "= -RV(M2)" with -- = RV(M2) --.

At column 20, line 42, please add -- $RVO(J) = RV(J) + \gamma - RV(M3) - RV(MY)$, where J is all other positions. -- above "The constant $\gamma$ is determined by trial and error. A range of".

At column 23, line 43, please replace "DM(TCA - DM(HDDV) - RV - (M0)$_{input}$" with --DM(TCA) - DM(HDDV) - RV(M0)$_{input}$ --.

Signed and Sealed this

Sixteenth Day of January, 2007

JON W. DUDAS  
*Director of the United States Patent and Trademark Office*